United States Patent [19]
Richter et al.

[11] Patent Number: 6,149,319
[45] Date of Patent: Nov. 21, 2000

[54] COMPUTER SYSTEM HOST ADAPTER FOR CONTROLLING SIGNAL LEVELS TO PERIPHERAL CARDS

[75] Inventors: Bryan M. Richter, Fremont; Stephen A. Smith, Palo Alto; Mike Assar, Morgan Hill; Abdul Q. Kashmiri; Jerry L. Clark, both of Fremont; Dave M. Singhal, San Jose, all of Calif.

[73] Assignee: Cirrus Logic, Inc., Fremont, Calif.

[21] Appl. No.: 08/388,615

[22] Filed: Feb. 14, 1995

Related U.S. Application Data

[60] Division of application No. 08/149,061, Nov. 8, 1993, Pat. No. 5,444,244, which is a continuation-in-part of application No. 08/016,574, Feb. 10, 1993, Pat. No. 5,300,835.

[51] Int. Cl.[7] .................................................. G06F 1/26
[52] U.S. Cl. ......................... 395/750.01; 395/750.08; 395/281; 364/707
[58] Field of Search ..................... 395/750, 281, 395/282, 283, 311, 750.08, 750.06; 364/707; 235/490

[56] References Cited

U.S. PATENT DOCUMENTS

| | | | |
|---|---|---|---|
| 4,472,647 | 9/1984 | Allgood | 326/65 |
| 4,775,808 | 10/1988 | Trumpp | 326/34 |
| 4,910,659 | 3/1990 | Gates et al. | 364/140 |
| 4,916,662 | 4/1990 | Mizuta | 365/52 |
| 5,056,060 | 10/1991 | Fitch et al. | 395/823 |
| 5,058,063 | 10/1991 | Wada et al. | 365/185.18 |
| 5,084,637 | 1/1992 | Gregor | 326/81 |
| 5,122,692 | 6/1992 | Seki | 326/67 |
| 5,128,560 | 7/1992 | Chern | 326/81 |
| 5,136,190 | 8/1992 | Chern et al. | 326/81 |
| 5,144,165 | 9/1992 | Dhong | 326/80 |
| 5,155,392 | 10/1992 | Nogle | 326/84 |
| 5,157,281 | 10/1992 | Santin et al. | 327/566 |
| 5,214,330 | 5/1993 | Okazaki | 326/90 |
| 5,245,224 | 9/1993 | Suzuki | 326/65 |
| 5,319,254 | 6/1994 | Goetting | 327/198 |
| 5,327,020 | 7/1994 | Ikeda | 327/206 |
| 5,331,219 | 7/1994 | Nakamura | 326/62 |
| 5,410,717 | 4/1995 | Floro | 395/284 |
| 5,511,171 | 4/1996 | Bowman | 395/283 |

OTHER PUBLICATIONS

3 Volt System Logic For Personal Computers Data Book, Advance Micro Devices 1992, pp. 1–100 to 1–103.
Digital Integrated Electronics, Taub & Schilling 1977, pp. 156–161, 273–277.
Harris Semiconductor CMOS Logic ICs App. Note, Apr. 1986, "QMOS HC/HCT Logic Designs For Battery–Powered Or Battery–Backed Up Operation" by J. Nadolski, pp. 1–5.
Linear Interface Integrated Circuits, Motorola Semiconductor Products 1979, pp. 4–21 to 4–23, 4–132 to 4–136.
CMOS Data Book, National Semiconductor 1977, pp. 1–106 to 1–113 & 1–116.

(List continued on next page.)

*Primary Examiner*—Jack B. Harvey
*Assistant Examiner*—Ario Etienne
*Attorney, Agent, or Firm*—Blakely, Sokoloff, Taylor & Zafman LLP

[57] ABSTRACT

A method and apparatus for maintaining the voltage level of data signals supplied to an integrated circuit, such as a PCMCIA card, at the same level as power also provided to the integrated circuit. Circuitry for maintaining the voltages at the same level is preferably embodied within a system having a card controller integrated circuit, a power supply, and a peripheral card socket for receiving a removable PCMCIA card. The power supply is controlled by the card controller to provide power to the PCMCIA card through the card socket at a voltage level matching internal voltage requirements of the PCMCIA card. The card controller is connected directly to the PCMCIA card by a signal transmission line. Circuitry is provided for ensuring that the voltage of data signals transmitted along the data bus line to the PCMCIA card substantially match the voltage of power provided from the power supply to the PCMCIA card along a power supply line. In this manner, damage resulting from a power mismatch within the PCMCIA card is avoided.

17 Claims, 13 Drawing Sheets

OTHER PUBLICATIONS

Interface Data Book, National Semiconductor 1978, pp. 4–4 to 4–13.

Advanced CMOS Logic ICs Data Book, GE Corp./RCA Division, Oct. 1988, pp. 16–20.

CMOS Integrated Circuits Data Book, RCA Corp., Aug. 1983, pp. 78–81, 418–421, 687–694.

RCA/LSI Products–Applications, RCA Corp., Jan. 1982, "Interfacing COS/MOS With Other Logic Families" by A. Havasy & M. Kutzin, pp. 59–70.

High Speed CMOS Data Book, SGS–Thomson Microelectronics, Oct. 1988, pp. 57–59.

Power MOS Devices Data Book, SGS–Thomson Microelectronics, Jun. 1988, "Novel Protection And Gate Drives For MOSFET's Used In Bridge–Leg Configurations", pp. 131–136.

The Interface Circuits Data Book, Texas Instruments 1977, pp. 373–384.

High–Speed CMOS Logic Data Book, Texas Instruments, Jun. 1989, "using High–Speed CMOS And Advanced CMOS Logic In Systems With . . ." by R. Curtis, pp. 4–17 to 4–25, 4–47 to 4–57.

$C^2$MOS Logic Data Book, Toshiba, Aug. 1990, "TC74AC/ACT & TC74HC/HCT Series", pp. AC48–AC51.

COMPUTER SYSTEM HOST ADAPTER FOR CONTROLLING SIGNAL LEVELS TO PERIPHERAL CARDS

RELATED APPLICATIONS

This is a divisional of application Ser. No. 08/149,061, filed Nov. 8, 1993, now U.S. Pat. No. 5,444,244 which issued on Aug. 8, 1995, which is a continuation-in-part of U.S. application Ser. No. 08/016,574 filed Feb. 10, 1993, now U.S. Pat. No. 5,300,835, for a CMOS Low Power Mixed Voltage Bi-directional I/O Buffer and assigned to the Assignee of the present application. The disclosure of U.S. Pat. No. 5,440,244 is incorporated herein by reference.

FIELD OF THE INVENTION

The invention generally relates to integrated circuits and particularly to the design of an integrated circuit in a system with mixed DC voltage supplies. The invention also generally relates to systems for controlling the voltage provided to a removable peripheral device, such as a memory card or Fax card, in a computer system. In particular, the invention relates to the control of voltage supplied to a peripheral card configured to the specifications of the Personal Computer Memory Card International Association (PCMCIA).

BACKGROUND OF THE INVENTION

DC Power consumption in electronic devices can be approximated by the equation $P=VI$ whereas AC power consumption can be approximated by the equation $P=CV^2F$. Thus power consumption is proportional to the voltage supply V or the square of the voltage supply $V^2$. In either case power consumption can be decreased by lowering the voltage supply such as from five volts to three and one third volts. Also decreasing the amount of current consumed will lower the power consumption. The decrease in DC supply voltage from five volts to three volts will approximately decrease power consumption by over forty percent. With the increase of portable electronics and battery operated systems the power consumption and operation time of portable units has become important. Electronics technology has changed from TTL to CMOS in order to decrease the current consumption thereby reducing power consumption. To further decrease power consumption it is desirable that the operating voltage be reduced.

Thus, to achieve low power consumption in portable computer systems it is necessary to operate at voltages below the present 5V CMOS and TTL DC power supply of 5.0V (volts) plus or minus 0.5V. JEDEC (Joint Electronic Development Engineering Committee) specified two standards for low power systems known as LVCMOS (Low Voltage CMOS or 3.3.V CMOS) and VTTL (Low Voltage TTL). Both of these standards require circuitry to operate with a 3.3V plus or minus 0.3V power supply. Other low voltage standards, such as LVBO CMOS (Low voltage Battery Operated CMOS) which operates with a DC power supply of 2.8V plus or minus 0.8V, are being prepared by JEDEC at this time. Each of these standards specify logic level values for inputs (VIH and VIL) and outputs (VOH and VOL). VIL is the maximum voltage at the input of the input buffer that will be recognized as logical zero. VIH is the minimum voltage level at the input of the input buffer that will be recognized as logical one. In a CMOS fabrication process output voltages generally range from ground to the maximum supply voltage. Thus for 3.3V CMOS the typical logic levels are 0V to represent logical zero and 3.3V to represent logical one. In 5V CMOS the typical logic levels are 0V to represent logical zero and 5V to represent logical one. However, in TTL fabrication the typical logic levels are 0.4V to represent a logical zero and 2.4V to represent a logical one. It is generally desirable to design a system with one type of logic family with similar logic levels. However due to the lengthy development cycle of integrated circuits, it may be a few years before note-book and hand-held computer designers have all the components necessary to design a complete system operating with only a 3.3V DC power supply. Presently most floppy disk and hard disk controller integrated circuits that interface with the ISA or EISA bus require a 5.0V power supply. Most flat panel and CRT Monitor display controllers require a 5.0V power supply as well. Presently most microprocessors and DRAMs require a 5.0V power supply to operate. Presently PCMCIA cards are being manufactured that operate at either 3.3V or 5.0V or both.

A system designer may need to design a system that operates with devices using a mixed set of DC power supplies. For example the designer may desire to design a system using a 3.3V memory, a 5.0V ISA bus, a PCMCIA interface for both 3.3V and 5.0V, and a circuit's internal core logic operating with a 3.3V or 5.0V power supply. Hence there is a need for integrated circuit components that operate internal core logic using a 3.3V power supply to conserve power and can simultaneously interface with other system components that generate 5V CMOS, TTL, 3.3V CMOS, or LVTTL logic levels from their respective DC power supplies.

In both mixed-voltage and low-voltage-only systems it is sometimes necessary to overdrive a bi-directional pin (also referred to as an Input/Output pin) with an input voltage that is greater than the DC supply voltage for the electronics of that bi-directional pin. For example assume the DC supply voltage is 3.3V. This device may have to receive an input signal that reaches a value of 5V from another device that has a DC supply voltage of 5V. It is also possible that transmission line effects will cause the input voltage to ring above 3.3V. In any case, it is desirable that power is not excessively consumed and that electronic components are not damaged.

Some prior-art methods for interfacing components of mixed DC supply voltages (also referred to as multiple DC supply voltages) to generate various logic levels use external components, such as diode clamps or voltage translators. Other prior-art methods use open-collector or open-drain output buffers that require an external pull-up resistor. These methods consume power because of extra current drawn from one of the DC supplies. Furthermore, many prior-art methods consider only unidirectional signals and not bi-directional signals, such as those within a data bus. Also such external components use space that is often very valuable, such as within a portable computer. Such additional components also reduce the reliability of a system.

This overdrive or overvoltage condition input at a pin of an integrated circuit was thought to be resolved by the PN junctions of the output transistors or the input protection diodes for an input only pin. Normally these diodes were reversed biased and had no effect on the electronic operation. However if the voltage applied to the pin becomes greater than the DC supply for that pin the diode forward biases. The diode then sinks current from the overvoltage source in order to reduce and maintain the amplitude at approximately 0.6V above the DC supply voltage. This input protection diode current increases power consumption. In systems that use mixed DC voltage power supplies the input protection diode current can be considerable and cause damage to electronic circuits. In the case of CMOS devices excessive input protection diode current can lead to an effect called "latch-up". Thus, in low voltage (low power) CMOS systems it is desirable that a different approach to handle overvoltage conditions and mixed DC voltage power supplies be found. This would reduce power consumption and decrease the potential for circuit damage.

FIG. 1 represents the schematic of a prior-art CMOS bi-directional I/O buffer. In this case the pin of the integrated circuit has a P-type transistor pull-up 150. Thus, a separate input protection diode is not needed because the PN junction between the transistor drain and the n-well (or n substrate as the case may be) of the P-type transistor 150 is a natural diode. This diode is reverse biased for input voltage levels below the DC supply voltage VDD.

Assume that the I/O buffer of FIG. 1 is in an input mode. Assume that the DC supply voltage VDD 120 is set to 3.3V. If the input voltage tries to overshoot or ring above VDD +0.6V, the diode between the P-type transistor drain and substrate will sink current and increase power consumption.

Now assume VDD 120 is set to 5.0V and the I/O buffer is in the-input mode such that the output buffer is tristated. Assume that 3.3V CMOS logic level signals are input to the PAD at node 101 where a logical one is represented by a voltage level of 3.3V. The inverter that consists of transistors 160 and 161 has 3.3V applied to their respective gate connections. Because VDD is set to 5V and 3.3V is applied to the gates of transistors 160 and 161 both transistors are in their on state. In this case each transistor is conducting and causes a current to flow from VDD to Ground (also referred to as VSS). In this document this current is referred to as a crowbar current and becomes nearly zero when either transistor 160 or 161 reach an off state. The off state for transistor 160 is reached when the input voltage at the PAD is above a value of VDD minus one P-type transistor threshold (VDD-VTP). The off state for transistor 161 is reached when the input voltage at the PAD is below a value of one N-type transistor threshold (VTN). Thus it is desirable to eliminate-the crowbar current to decrease power consumption while supporting mixed logic level signals.

The prior-art tristate output buffer consists of a P-type power transistor 150, an N-type power transistor 151, a NAND gate pre-driver (consisting of transistors 152, 153, 154, 155), and a NOR gate pre-driver (consisting of transistors 156, 157, 158, and 159). Signal OEN* 103 is a signal from the core logic that tristates the power transistors 150 and 151. The "*" after a signal name represents that the signal is active low. Thus OEN* is an active low signal. In the case that the output buffer is tristated OEN* is logical one. OEN* is inverted by the inverter consisting of transistors 164 and 165 to generate OEN signal 104. If OEN* is a logical one OEN is a logical zero. OEN* is input to the NOR pre-driver at transistors 157 and 158. In this case OEN* is a logical one and forces the NOR output 111 to be a logical zero. Thus, transistor 151 is turned off because the gate voltage is 0V. OEN 104 is input into the NAND pre-driver at transistors 154 and 152. In this case OEN is a logical zero and the NAND output 110 is forced to a logical one. Thus transistor 150 is turned off because the gate voltage is VDD volts. For the case that OEN* is a logical one, power transistors 150 and 151 are both off thereby tristating the output buffer.

In the case that the output buffer is turned on and not tristated, OEN* 103 is a logical zero. OEN 104 is a logical one. The NAND pre-driver is enabled and acts like an inverter of DO signal 102. Similarly the NOR pre-driver is enabled and acts like an inverter of DO signal 102. If DO 102 is a logical one, both the NAND pre-driver output 110 and the NOR pre-driver output 111 are logical zero. This turns on transistor 150 and keeps transistor 151 turned off. The PAD output 101 is charged towards VDD to represent a logical one. In the case that DO 102 is a logical zero, both the NAND pre-driver output 110 and the NOR pre-driver output 111 are logical one. This turns on transistor 151 and keeps transistor 150 turned off. The PAD output 101 is discharged towards Ground to represent a logical zero.

To conserve power the core logic that generates the signals OEN* 103 and DO 102 may have the power supply reduced. With the reduced power supply, the voltage representing binary logical values for OEN* and DO may be reduced to a range of 0V to 3.3V. The logic one value represented by 3.3V is insufficient to properly drive an output buffer with a 5V power supply. The 3.3V causes crowbar currents in the output buffer. The PAD voltage levels are reduced from the normal range of 0 to 5V. The rise, fall, and propagation times are greatly effected by the core logic voltage difference. Therefore it is desirable that the core logic with a different supply voltage be able to properly drive an output buffer.

One important application of the above-described I/O buffers is within an integrated circuit device for controlling a removable peripheral card within a computer system. For example, many computer systems include a card socket for receiving a removable PCMCIA peripheral card which may be a hard-disk card, a fax/modem card, or other similar device. In such computer systems, an integrated circuit card controller device provides an interface between a host microprocessor and the PCMCIA card. Typically, the card controller is configured to operate at a single voltage level, such as 3.3V. However, the PCMCIA card may include internal integrated circuitry design to operate at one or more different voltages levels, such as 5.0V. For the card controller to properly communicate with the PCMCIA card, it is desirable to include an I/O buffer within the card controller which is capable of converting signals from PCMCIA card voltage levels to the internal voltage of the card controller. In the foregoing example, such an I/O buffer would preferably convert 5.0V voltage signals to 3.3V signals. Since the PCMCIA cards are removable and can be replaced with other cards operating at different internal voltages, the I/O buffer of the card controller is preferably capable of properly receiving any one of several different voltage signals for conversion to the internal voltage of the card controller. Accordingly, it would be desirable to provide an I/O buffer for use in a card controller, or other device, which is capable of receiving or transmitting signals at a variety of voltages and which avoids the various disadvantages of conventional I/O buffers described above.

Other problems may also occur in the supply of power to PCMCIA cards, or similar devices. Typically, power is supplied to the PCMCIA card from a power supply device through a PCMCIA socket. A power enable signal is transmitted to the power supply device from the card controller to initiate the supply of power to the PCMCIA card through the card socket. Because of internal impedance within the PCMCIA card, a delay may occur between when the enable signal is output from the card controller device and when the PCMCIA card actually reaches full power. However, the card controller and the PCMCIA card are also interconnected with a data bus which may begin transmission of data signals to the PCMCIA card before the PCMCIA card is adequately powered. As such, a mismatch may occur within the PCMCIA card between the voltage of power supplied to the card and the voltage of signals received along the data bus. Such a mismatch may irreparably damage the PCMCIA card. It would be desirable to provide circuitry for ensuring that the voltage level of power supplied to the PCMCIA card matches the voltage levels of data signals transmitted to the card.

Although the foregoing voltage mismatch problems have been described primarily with reference to devices for controlling and for providing power to a PCMCIA card, many of these problems also occur in other systems having two or more integrated circuits which must interface but which operate at different internal voltage levels.

Regarding the following descriptions and the attached drawings, please note in the figures that wires crossing over do not connect unless the cross-over is highlighted by a darkened circle such as that at node 110. Wires that join at a "T" are understood to represent a connection and may also be highlighted by a darkened circle. Input protection resistor 190 is used to protect the gate oxide of transistors handling a device. The resistor absorbs some of the energy that is transferred into the integrated circuit from an external source.

BRIEF SUMMARY OF THE INVENTION

In accordance with one aspect of the invention, an input buffer within an integrated circuit is provided with means for receiving input signals at any of a variety of different voltages and for converting those input signals to a core voltage signal which may vary depending upon a specific installation voltage. Preferably, the input buffer includes a plurality of two input NOR gates with each NOR gate having a first input connected to an input line and a second input connected to a core voltage selection line. Separate voltage lines provide power to each of the NOR gates at the core voltage level. Triggering levels of each of the two-input NOR gates are optimized to different core voltage levels to allow the input buffer to properly distinguish between input high signals and input low signals in a binary input signal. In other words, one NOR gate may be optimized to a core voltage of 3.3V, whereas a second NOR gate is optimized to a core voltage of 5.0V. Outputs of each of the two-input NOR gates are connected to a single multiple-input NOR gate which provides a single signal to core logic of the integrated circuit.

In a preferred embodiment, a pair of two-input NOR gates are provided. The core voltage of the integrated circuit is set at installation to either 3.3V or 5.0V. The triggering level of the first NOR gate is set to 1.6V, whereas the triggering level of the second NOR gate is set to 1.4V. With the aforementioned triggering levels and power interconnections, the input buffer is capable of properly receiving either 5.0V input signals or 3.3V input signals, of either CMOS or TTL variety, regardless of whether the core voltage of the integrated circuit is set to 3.3V or 5.0V. The input buffer is preferably used in connection with an output buffer capable of translating internal core voltages to an external voltage matching the voltage of an external device such as a PCMCIA card.

In accordance with another aspect of the invention, a method and apparatus are provided for maintaining the voltage level of control and data signals supplied to an integrated circuit, such as a PCMCIA card, at the same level as power also provided to the integrated circuit. The means for maintaining the voltages at the same level is preferably embodied within a system having a card controller integrated circuit, a power supply, and a peripheral card socket for receiving a removable PCMCIA card. The power supply is controlled by the card controller to provide power to the PCMCIA card through the card socket at a voltage level matching internal voltage requirements of the PCMCIA card. The card controller is connected directly to the PCMCIA card by a signal transmission line. Circuitry is provided for ensuring that the voltage of data signals transmitted along the data bus line to the PCMCIA card substantially matches the voltage of power provided from the power supply to the PCMCIA card along a power supply line. In this manner, damage resulting from a power mismatch within the PCMCIA card is avoided.

In a preferred embodiment, the forgoing is achieved by connecting the power supply line to the card socket and to an input pin of the card controller device. A connection is provided within the card controller between the slot voltage input pin and an multivoltage I/O buffer connected to the signal transmission line. More specifically, the multivoltage I/O buffer is configured for receiving power from the slot voltage power supply line. In this manner, data cannot be transmitted along the signal transmission line to the PCMCIA card until power is also provided to the PCMCIA card from the power supply. Moreover, by powering the multivoltage I/O buffer using the same power line that is connected to the PCMCIA card, an instantaneous voltage level output by the multivoltage I/O buffer onto the signal transmission line substantially matches the voltage level of power supplied to the PCMCIA card.

Thus, the various aforementioned problems and disadvantages occurring within multivoltage power supply and control systems and integrated circuits are avoided. Other advantages, features and objects of the invention will be apparent from the drawings and from the detailed description, which follows.

BRIEF DESCRIPTIONS OF THE DRAWINGS

DETAILED DESCRIPTION OF PREFERRED EMBODIMENTS

Mixed Voltage Bi-directional I/O Buffer

The present invention includes a method and apparatus for a low power CMOS bi-directional (input and output or I/O) device typically located at bonding PADS on I/O pins of integrated circuits. In the case of driving signals out of an IC, the invention can translate internal low voltage logic signals into various logic level output signals. In the case of receiving signals, the invention can translate various logic level input signals into internal low voltage logic level signals. In either case power consumption is minimized by the invention in order to maximize the operating time for a battery operated portable system.

The invention ideally supports a system with mixed voltages. In mixed voltage systems, a bi-directional data bus has various logic level signals present because of other DC supply voltages used to operate components interfacing with the data bus. The invention accepts various logic level inputs from these components and reduces normal power consumption associated with receiving the various logic levels. At the same I/O PAD the invention will output user selectable logic levels by an appropriate choice of DC supply voltage to the invention. Within the same device, the invention further provides the capability to output at a group of pins one set of logic levels and to output at another groups of pins a different set of logic levels.

Figure 2:
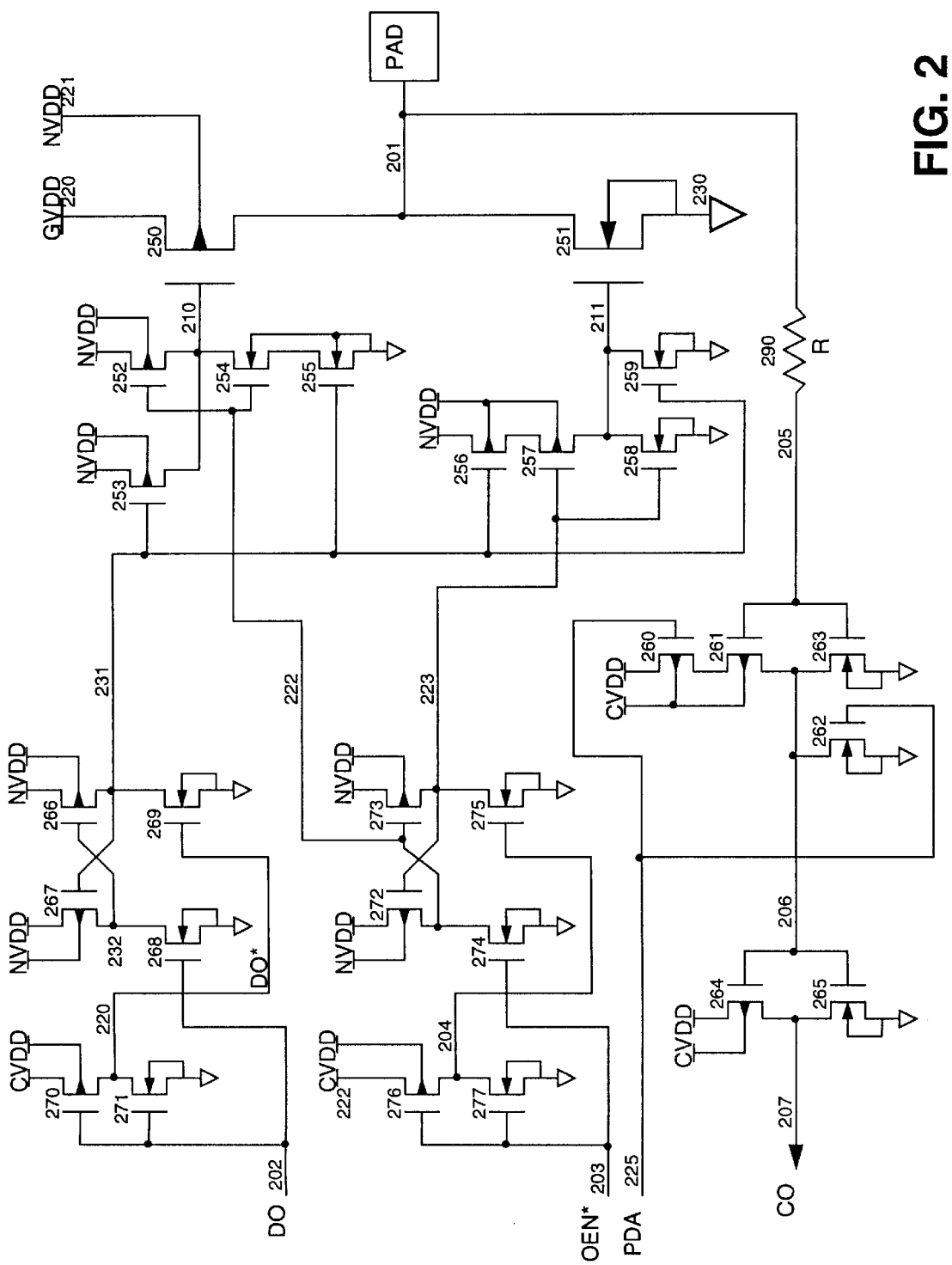
FIG. 2 shows a schematic diagram of a bi-directional I/O buffer that provides low power consumption for systems with mixed DC supply voltages.
Figure 6:
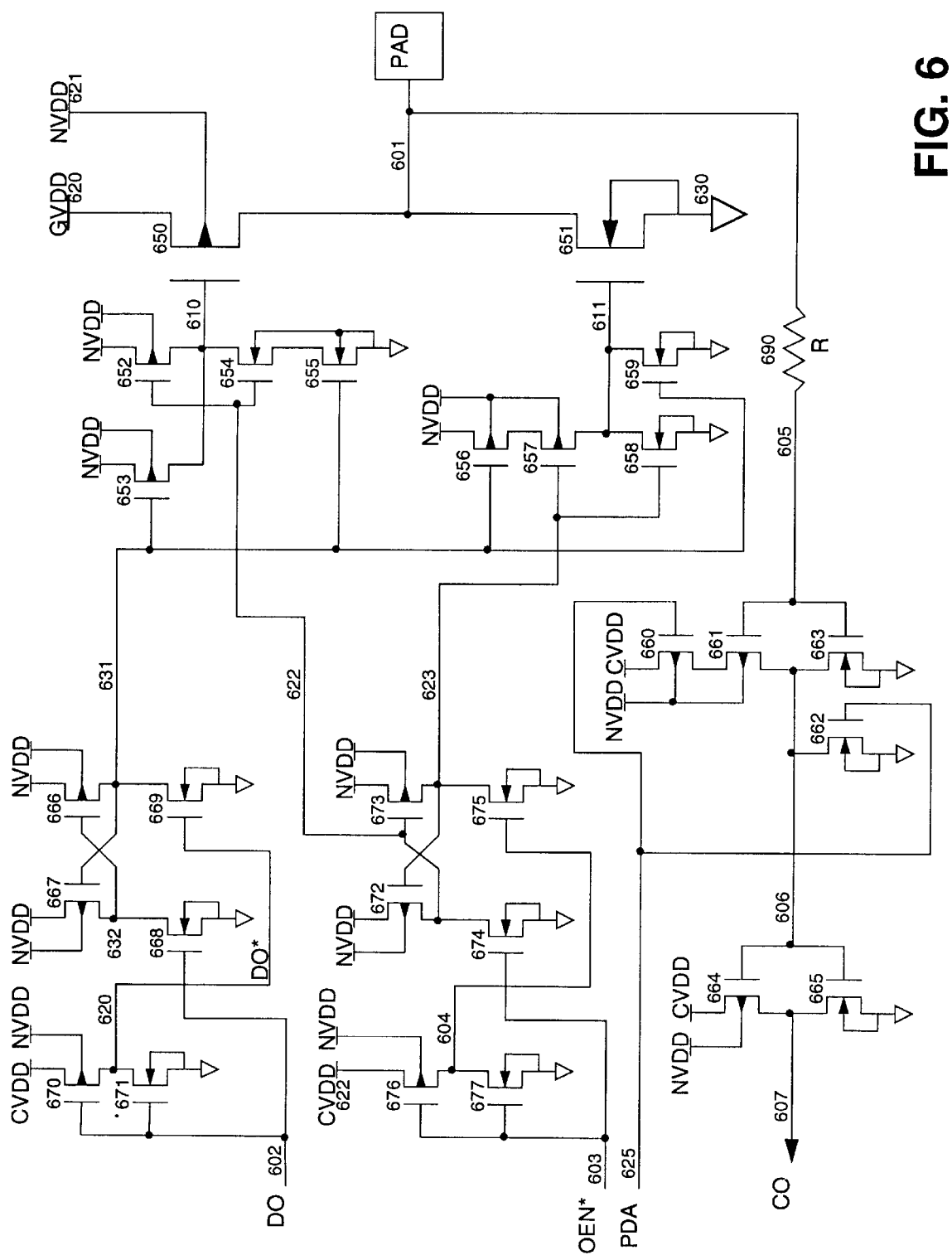
FIG. 6 illustrates the schematic diagram of FIG. 2 in the case that the fabrication process is of a type that provides a p-well for the N-type transistors and an n-substrate for the P-type transistors.

The invention can be manufactured in different CMOS (Complimentary Metal Oxide Semiconductor) processes. FIG. 2 illustrates the invention manufactured in a CMOS process that either contains an n-well or both an n-well and a p-well (also known as twin-tub). FIG. 6 illustrates the invention manufactured in a CMOS process that contains only a p-well such that the n minus substrate is tied to the DC supply voltage NVDD. P-type transistors (also referred to as PFET or PMOS transistor) are represented by the transistor symbol of transistor 270 in FIG. 2. N-type transistors (also referred to as NFET or NMOS transistor) are represented by the transistor symbol of transistor 271 in FIG. 2. The reference to P-type or N-type transistor is not generally used in the text but can be discerned from the figures.

The N-type transistors are assumed to have their respective P substrate or P well (twin tub) tied to Ground or 0V as indicated by the transistor symbol. The symbol for ground is the triangle symbol at node 230 of FIG. 2. Assume that each N-type transistor that has a connection to this ground symbol is tied to Ground. The power source for Ground is sometimes referred to as the negative power supply or VSS and in digital CMOS circuitry it is usually represented by 0V.

The bi-directional or I/O buffer consists of two main elements. The first is an input buffer consisting of transistors 260 through 265 in FIG. 2. The second element is an output buffer consisting of transistors 250 through 259 and 266 through 277. Each of these elements is connected together at a PAD at node 201 in FIG. 2. Signals received at the PAD by the invention are input into the input buffer. Signals output at the PAD by the invention are output from the output buffer. The PAD is represented by a square in FIG. 2. The PAD is a bonding surface that allows for a wire from an integrated circuit package to connect a pin of the integrated circuit package to the electronics within a semiconductor substrate.

Input Buffer

The design of the first stage of the input buffer is similar to the design of an inverter that can receive various input logic levels. For the Input buffer to translate 5V CMOS logic level input signals, 3.3V CMOS logic level input signals, and TTL logic level input signals into logic signals the core logic understands, we desire the characteristics of a CMOS inverter with a switching threshold designed to worst case conditions. TTL families generally provide the worst case conditions such that VIH=2.0V and VIL=0.8V for the LVTITL DC supply voltage of 3.3V. However, Low Voltage Battery Operated CMOS specifies that VIH=1.4V and VIL= 0.4V for the minimum DC supply voltage of 2.0V. By designing for LVTTL we will show that LVBO CMOS conditions are satisfied as well. To satisfy LVTTL conditions it is desirable that the input buffer switching threshold be set at the midpoint between 2.0V and 0.8V or 1.4 V for a DC supply voltage of CVDD. CVDD will typically be 3.3V to match the LVTTL DC supply voltage. Using SPICE analysis, the inverter switching threshold is set by sizing the width and length of the P-type and N-type transistors of the first stage of the input buffer. The inverter switching threshold is not an absolute voltage but varies in proportion to the DC supply voltage. As the DC supply voltage decreases from 3.3V to 2.0V the inverter switching threshold decreases as well. JEDEC specified that LVBO CMOS can reach a minimum DC supply voltage of 2.0V. SPICE analysis of this invention shows that the input buffer operates as low as the LVBO CMOS supply voltage of 2.0V and will properly receive the appropriate logical zero or logical one for respective logic levels of VIL=0.4V and VIH=1.4V. Therefore by designing the input buffer for LVTTL logic levels and a DC supply voltage of 3.3V, the LVBO CMOS logic levels are satisfied as well. While an inverter may be ideal, it is desirable to turn off an input buffer when not reading signals from the PAD. This reduces power consumption. A NAND or NOR gate, designed to model the switching characteristics of an inverter as described above, can be used to selectively turn on and off the first stage of the input buffer.

In FIG. 2 the first stage of the input buffer consists of a NOR gate (transistors 260, 261, 262, and 263). This stage is designed to simulate an inverter when it is enabled by Power Down (PDA) signal 225. The internal core logic voltage supply (CVDD) is typically 3.3V which is the power supply to the first stage of the input buffer at transistor. 260. Thus when the first stage is enabled it acts like an inverter with a switching threshold 1.4V designed to meet LVTTL logic levels and a DC supply voltage of 3.3V. Recall that LVTTL and LVBO CMOS are worst case conditions for logic levels and that the design of an input buffer with a 1.4V switching threshold for a 3.3V DC supply voltage satisfies these requirements. Because the 5V CMOS specifications for VIH and VIL is less stringent than the LVTTL requirements, the 1.4V switching threshold for an input buffer with a DC supply voltage of 3.3V will meet the 5V CMOS logic levels. Therefore the switching threshold of 1.4V satisfies many external voltage requirements including 5V CMOS, 3.3V CMOS, TTL, LVTTL, and LVBO CMOS. Please note that when the input buffer is operational power is more greatly consumed by the TTL and LVTTL specifications for VIL and VIH because of crowbar currents. Providing rail to rail levels (or within 10% of each power supply rail) at the input of the input buffer conserves power in its operational mode because either a P-type transistor or an N-type transistor is in its off state.

The second stage of the input buffer is an inverter consisting of transistors 264 and 265 in FIG. 2. This inverter serves the same function as the inverter consisting of transistors 162 and 163 in FIG. 1. This inverter ensures polarity presented to the core logic at CO output 207 is the same as the PAD polarity. It further provides the desired drive for CO output 207 to overcome internal capacitance within a desired time period. At output CO 207 in FIG. 2 the voltage level representing a logical one is CVDD volts because the input buffer's power supply is CVDD at transistor 264. Therefore, the input buffer executes the translation for a logical one from various logic levels at its input into CVDD volts at CO output 207. CO output 207 is an active high signal with logic levels translated from those at the PAD. CO is sent internally to the core logic of a device to use the signal received at the PAD to perform various functions within a device that contains the invention. This second stage of the input buffer consisting of transistors 264 and 265 may be optional if a weak active low signal is acceptable to the internal core logic. Thus a signal directly from the first stage of the input buffer at node 206 may be driven into the core.

Figure 1:
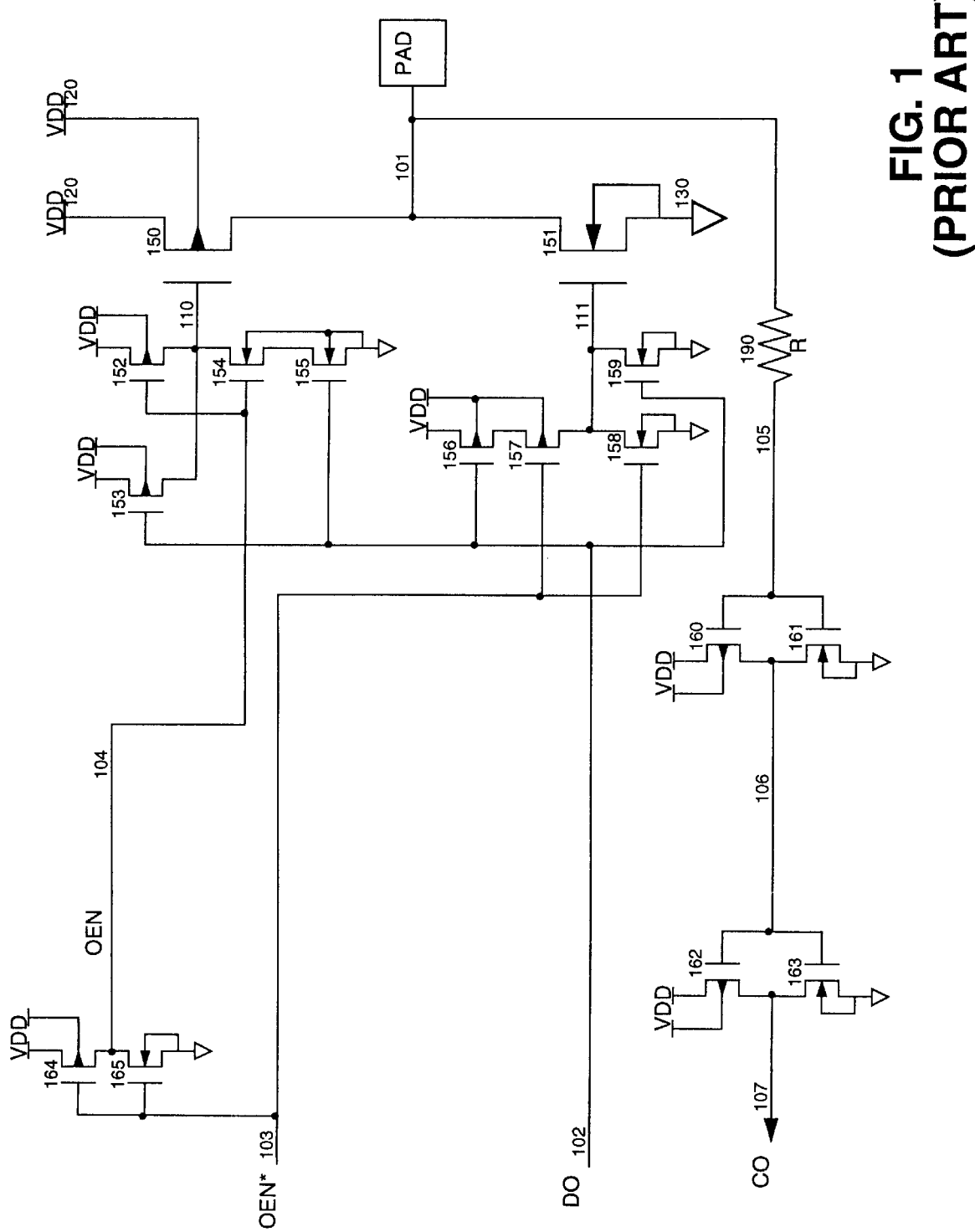
FIG. 1 shows schematic diagram of a prior-art CMOS bi-directional I/O buffer.

In the prior-art the first stage of an input buffer is an inverter. FIG. 1 illustrates the prior-art inverter by transistors 160 and 161. This inverter is constantly enabled and consumes considerable AC power upon switching from rail to rail. Further if the voltage levels are not rail to rail ut are TTL logic levels of VIH=2.0V and VIL=0.8V, the inverter consumes even more power from both AC switching and DC power due to crowbar currents. Power consumption is even greater If an inverter input is allowed to float. In this case there is no guarantee as to what voltage level is applied to the inputs of the inverter. The inverter may toggle randomly from high to low. Thus the inverter and its respective transistors pass through the linear region of a transistor's functional curve such that it draws current and consumes power. Alternatively if the inverter input is floating, the input could establish a DC level where large crowbar currents consume power. Even pins that are properly receiving signals consume power. If input signals are not needed by the core logic then an inverter driven from rail to rail is consuming AC switching power needlessly. Thus when not reading signals into the core logic, the first stage of the input buffer can be set (referred to as disabled) to ignore all signals at the PAD, including signals that are floating, such that power consumption can be reduced.

In the invention the first stage of the input buffer is a NOR logic gate which can be set such that it conserves power. PDA signal 225 selectively sets the first stage of the input buffer when signals are not being received by the invention. PDA signal has a voltage of CVDD as its high logic level. If PDA signal is high it forces the CO output 207 to be high, regardless of the signal at the PAD. In this case the PAD level could be floating in a range of values and not disturb the logic level within the device. This also minimizes power consumption for PADs that actually do float.

This power savings is accomplished in the invention by the use of a NOR gate (consisting of transistors 260, 261, 262, and 263 in FIG. 2) as the first stage of the input buffer. If input 205 of the NOR gate floats, PDA input 225 when set high forces the NOR gate output into a fixed state so that it does not actively draw power. When reading signals from the PAD, PDA signal 225 is low and does not affect the logic values received by the input buffer. The PDA signal 225 can control all pins or selected groups of pins within an integrated circuit with the use of either soft-ware (control register bit(s)) or hard-ware (a dedicated pin).

Those skilled in the art will recognize that a NAND gate can be used in place of the NOR gate. This reduces power consumption by ignoring signals at the PAD and forcing the NAND output to a fixed state. In this case CO output 207 is forced low if the second input to the NAND, input enable (IEN), is set low.

Output Buffer

In general the output buffer translates low level voltage signals from the core logic into the desired logic level signals at the PAD. In FIG. 2 the desired output level is selected by setting GVDD 220 to the appropriate DC supply voltage such as 5V or 3.3V. Translation first starts by converting the core logic level signals into the highest power supply level of the system. The highest power supply voltage must be applied as the NVDD connection for transistors in FIG. 2. Thus the core logic level signals DO 202 and OEN* 203 must first be converted to the NVDD level in the system.

To select the desired output logic level, the final P channel transistor 250 has GVDD tied to its source 220. However the N-WELL of transistor 250, is tied to NVDD for reasons that are discussed below. Other logic gates before the final output stage of transistors 250 and 251 are also powered by NVDD. If this were not the case, the voltage present at gates 210 and 211 of transistors 250 and 251 would not provide the proper drive levels to meet output specifications of VOH, VOL, rise, fall, or propagation delayr.

Signal DO 202 is the data that is desired to be transferred from the core logic out to the PAD. OEN* signal 203 represents the output enable signal that tristates the output when OEN* is high. The * after the signal name represents that the signal is active low. Thus, the invention ensures that if OEN* is low, the logic value asserted at DO 202 is output to the PAD. In the case that OEN* is high, the final stage of the output buffer is disabled. Transistors 250 and 251 are off and do not source or sink current into or out of the PAD.

Voltage Translation

Voltage levels of the core logic signals DO and OEN* need to be translated into voltage levels that may be used to drive the final stage of the output buffer. Logical zero (also referred to as a low logic level) is represented by 0V and does not require translation. However logical one (also referred to as a high logic level) of signals DO and OEN* is represented by a voltage of CVDD which must be translated into a voltage level of NVDD. This is accomplished by the use of voltage translators. In FIG. 2 the inverter consisting of transistors 270 and 271 in conjunction with the cross wired transistors of 266, 267, 268, and 269 represents the voltage translator for the signal DO. The inverter consisting of transistors 276 and 277 in conjunction with the cross wired transistors of 272, 273, 274, and 275 represents the voltage translator for the signal OEN*.

The N-type transistor threshold in a typical semiconductor fabrication process varies from 0.6 to 1.2V. The N-type transistors 268, 269, 274, and 275 will turn on for a voltage applied to their respective gates that is greater than the N-type transistor threshold voltage. This places an operational limit on the core voltage CVDD such that it must be greater than the N-type transistor threshold voltage of the specified semiconductor process. Typical maximum N-type transistor threshold voltage is 1.2V. Thus the voltage translators will operate correctly with any CVDD DC supply voltage that is greater than 1.2V. This allows chips to be designed with voltage translators that operate with a CVDD DC supply voltage from below 2.0V up to NVDD volts, which is typically 5V or 6V.

N-type transistors 268, 269, 274, and 275 and P-type transistors 272, 273, 274, and 275 are respectively ratioed such that for a worst case value of CVDD equal to 3.0V and a worst case value of NVDD equal to 5.5V the N-type transistor (such as transistor 268) can overcome the current supplied by the P-type transistor (such as transistor 267) to flip the voltage translator to the opposite state. This assures that the design of the voltage translator can translate 3.3V CMOS logic levels into 5V CMOS logic levels or 3.3V CMOS logic levels into 3.3V CMOS logic levels or 5V CMOS logic levels into 5V CMOS logic levels. Thus, CVDD can be set to a 3.3V DC supply voltage and NVDD can be set to a 5V DC supply voltage, or CVDD can be set to a 3.3V DC supply voltage and NVDD can be set to a 3.3V DC supply voltage, or CVDD can be set to a 5V DC supply voltage and NVDD can be set to a 5V DC supply voltage, all with power supply tolerances of plus or minus ten percent and in each case the voltage translator properly translates the respective logic levels. maximum N-type transistor threshold voltage is 1.2V. Thus the voltage translators will operate correctly with any CVDD DC supply voltage that is greater than 1.2V. This allows chips to be designed with voltage translators that operate with a CVDD DC supply voltage from below 2.0V up to NVDD volts, which is typically 5V or 6V.

N-type transistors 268, 269, 274, and 275 and P-type transistors 272, 273, 274, and 275 are respectively ratioed such that for a worst case value of CVDD equal to 3.0V and a worst case value of NVDD equal to 5.5V the N-type transistor (such as transistor 268) can overcome the current supplied by the P-type transistor (such as transistor 267) to flip the voltage translator to the opposite state. This assures that the design of the voltage translator can translate 3.3V CMOS logic levels into 5V CMOS logic levels or 3.3V CMOS logic levels into 3.3V CMOS logic levels or 5V CMOS logic levels into 5V CMOS logic levels. Thus, CVDD can be set to a 3.3V DC supply voltage and NVDD can be set to a 5V DC supply voltage, or CVDD can be set to a 3.3V DC supply voltage and NVDD can be set to a 3.3V DC supply voltage, or CVDD can be set to a 5V DC supply voltage and NVDD can be set to a 5V DC supply voltage, all with power supply tolerances of plus or minus ten percent and in each case the voltage translator properly translates the respective logic levels.

The cross wired transistors of 272, 273, 274, and 275 logically operate similar to a pair of cross coupled Since DO* is transitioning from 0 to CVDD volts this turns on transistor 269 and causes node 231 to transition from NVDD volts to 0V. In this manner, logical zero represented by 0V and logical one represented by CVDD volts within the core logic are respectively translated into 0V and NVDD volts. Note that node 231 represents the logical equivalent of DO and is connected to the tristate output buffer NAND gate and NOR gate pre-drivers to drive the logic state out to the PAD.

The voltage translator for OEN* signal 203 is nearly identical and operates in the same way. The only difference is that both outputs of this voltage translator are used to enable or disable the tristate output buffer. Note that node 222 logically represents OEN and node 223 logically represents OEN*.

Power Transistors

Figure 3:
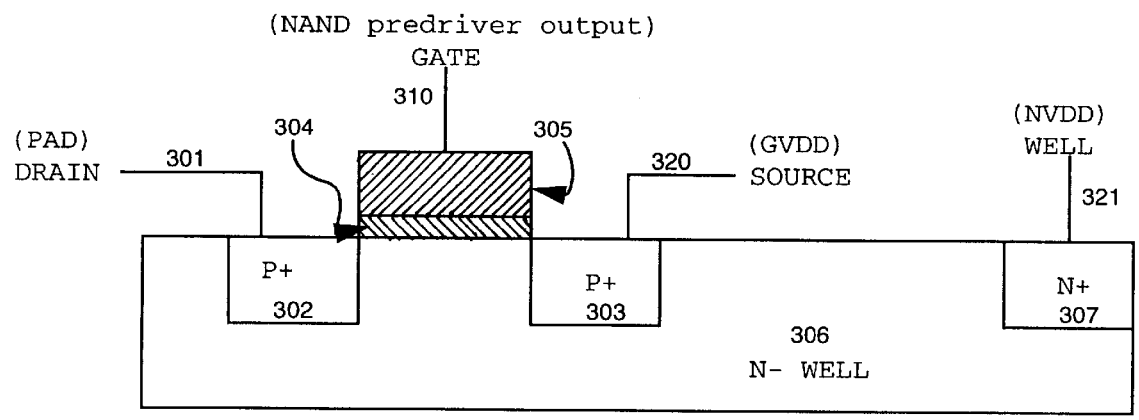
FIG. 3 illustrates a cross section of a P-type transistor in a silicon substrate.
Figure 4:
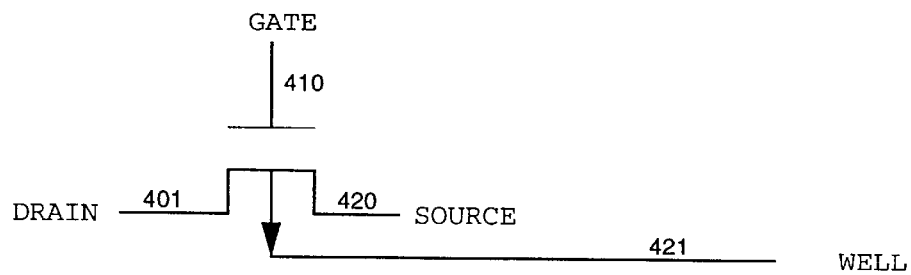
FIG. 4 illustrates the schematic representation of the P-type transistor as illustrated by FIG. 3.
Figure 7:
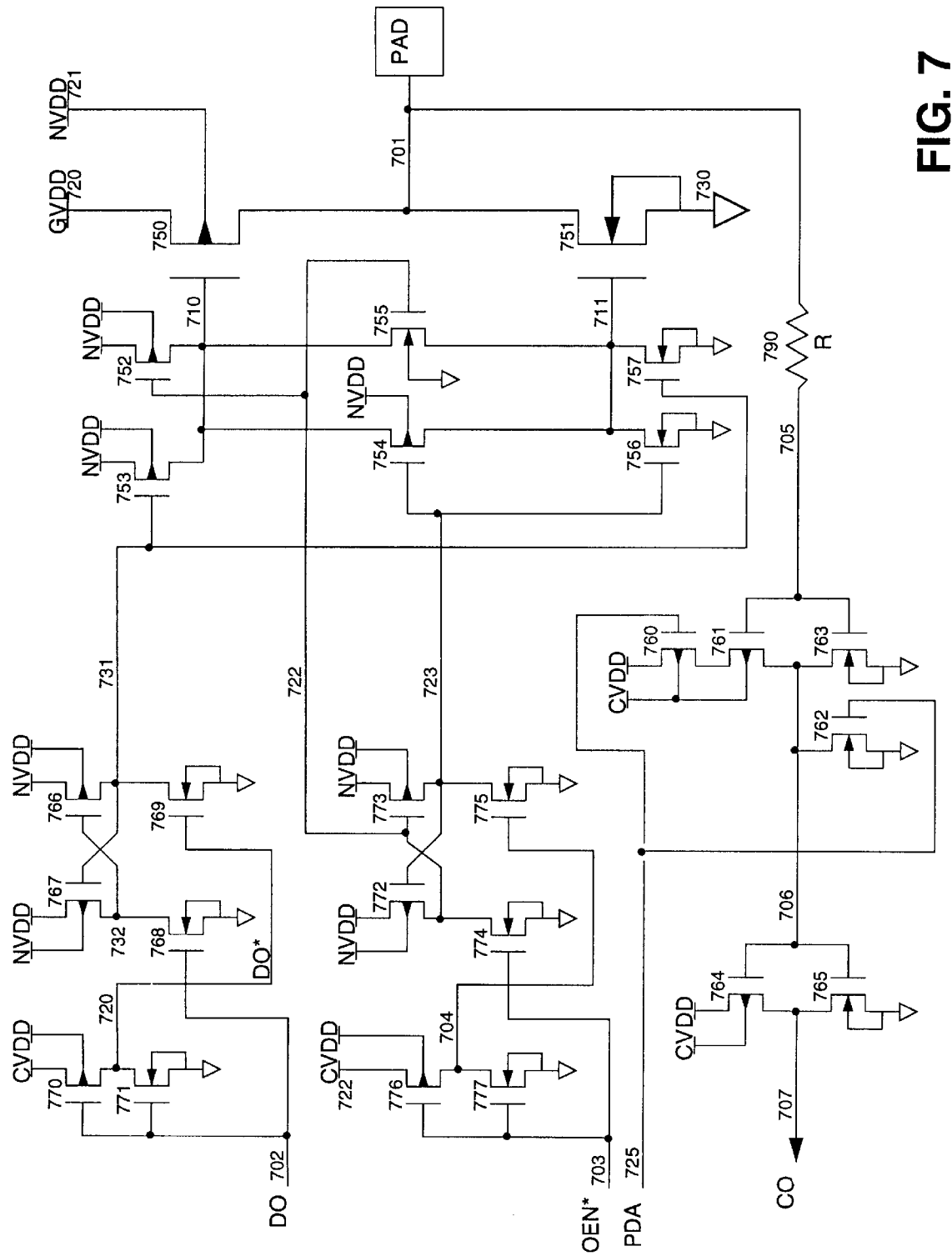
FIG. 7 illustrates an alternative embodiment of the invention of FIGS. 2–7.

Outputs of the two voltage translators are input to a NAND gate, consisting of transistors 252, 253, 254, and 255, and a NOR gate, consisting of transistors 256, 257, 258, and 259. The NAND gate controls the power P-type pull-up and the NOR gate controls the power N-type pull-down. These two logic gates are the pre-drivers for the power transistors aid facilitate the tristate mechanism as well as provide the correct polarity of DO to the PAD. The NAND gate is also referred to as the NAND pre-driver. The NOR gate is also referred to as the NOR pre-driver. An alternative embodiment of the invention replaces the NAND and NOR gate pre-drivers with transistors 752 through 757 as illustrated by FIG. 7, The P-type power transistor 250 can be illustrated by FIG. 3 and FIG. 4. FIG. 3 shows the cross section of the transistor in a silicon substrate. The well connection 321 is tied to NVDD 221 of FIG. 2. The source connection 320 is tied to GVDD 220 of FIG. 2. The gate connection 310 is tied to the output 210 of the NAND pre-driver. The drain connection 301 is tied to the PAD at output 201. FIG. 4 represents the transistor schematic of FIG. 3.

Recall that NVDD is the highest voltage power supply within the system. The source, GVDD 220, of transistor 250 may be less than or equivalent to NVDD. The power supplied to the pre-driver NAND and NOR gates is NVDD. Thus this level of voltage can be applied to gates 210 and 211 of the power transistors 250 and 251. Since NVDD is greater or equal in voltage to GVDD the NAND pre-driver will correctly drive the P-type power transistor into the appropriate switching region. This is the case regardless whether GVDD is set to 3.3V or 5V so long as it is less than or equal to NVDD. The N-type power transistor operates similar to the prior-art method of switching characteristics.

Assume that in FIG. 2 the overall I/O buffer is in an input mode such that the output buffer is tristated and the input buffer is enabled. The P-type power transistor is configured in this invention so that its n-well is tied to NVDD. Inherent to the P-type transistor are diodes between the drain and n-well as well as the source and n-well. The drain diode is illustrated in FIG. 3 at the junction of the P+ 302 and the N–WELL 306. The source diode is illustrated by the junction of the P+ 303 and the N- WELL 306. Both of these diodes will not turn on (forward bias) until the drain 301 or source 320 is typically 0.6V greater than the voltage tied to the WELL 321. The drain diode is normally reversed bias so that it will not draw current from the pin until the voltage on the PAD is greater than a diode threshold above NVDD. For example if NVDD is 5V and the diode threshold is 0.6V, the diode will not draw current until the voltage at the PAD is 5.6V. Recall that the invention requires that NVDD be the highest voltage power supply. Thus GVDD is less than or equal to NVDD which keeps the source diode in a reverse bias such that only leakage currents consume power. With the I/O buffer in an input mode the NAND pre-driver has tristated transistor 250 so that the gate voltage is set to NVDD. This keeps the P-type power transistor turned off for PAD voltages up to NVDD plus the P-type gate threshold voltage. Therefore, GVDD may be set to a range of voltages below NVDD, such as 3.3V, and will not effect power consumption. In general, this configuration of the P-type power transistor, allows the PAD voltage to reach a level of NVDD plus a diode threshold without an increase in power consumption. This configuration of the P-type transistor is an element of the invention that conserves power for a system of mixed power supply voltages.

In comparison to the invention, the prior-art P-type power. transistor's (150) n–well and source are both tied to VDD (120) as illustrated in FIG. 1. If the PAD input voltage is above VDD, the drain diode, represented by the junction of P+302 and the N-WELL 306, is forward biased. If the PAD input voltage is 0.6V or more above VDD, the diode draws current from the external device driving the PAD whereby power is consumed. Also the prior-art P-type power transistor can not source a different power supply voltage other than VDD. In the case that VDD is set to 3.3V, the PAD can not accommodate signals that are normally driven to 5V without considerable power consumption.

Thus the invention provides bi-directional voltage translation and low power consumption for signals input to an integrated circuit that may be greater than the desired output logic levels.

Advantages

This invention supports a bi-directional data bus that can contain various logic level signals without extra consumption of power or external components. For example the invention can support a data bus that uses both 3.3V CMOS logic levels as well as 5V CMOS logic levels. In the prior-art of FIG. 1 (and also in the RCA CD40116 data sheet) only single logic levels are supported. Consideration was not given to support at the same bi-directional I/O pin multiple logic level families such as 3.3V CMOS logic levels, 5V CMOS logic levels, and TTL logic levels. These references do not teach that the n-well and source of the P-type power transistor within an I/O buffer at a bi-directional pin (transistor 250 in FIG.2) could be separated to support multiple logic levels and reduce power consumption.

For example assume a first peripheral CMOS part operates with a DC supply voltage of 5V. A second peripheral CMOS part operates with a DC supply voltage of 3.3V. The device containing the invention has the GVDD DC supply voltage set to 3.3V. The NVDD DC supply voltage is set to 5V. CVDD DC supply voltage is set to 3.3V. In the case that the first peripheral CMOS device drives the data bus it attempts to output a logical one at a 5V level. The device containing the invention allows a 5V logical one without consuming power. However, the second peripheral CMOS device operating at 3.3V without the invention will attempt to clamp the data bus at approximately 4V and sink current from the first peripheral CMOS device by means of its input protection diodes. In the case that the device containing the invention is driving the data bus, a logical one will be represented by an output of 3.3V. This properly drives the second peripheral device such that its input buffer is at its ideal value without being overdriven where its input protection diodes would turn on and sink current. The first peripheral device will consume some power because it does not have its input driven to the ideal value of 5V. This is similar to the case that the second peripheral CMOS device is driving the data bus. Note that most 5V CMOS components are designed to receive TTL logic levels (VIH=2.0V, VIL=0.8V) and thus the first peripheral device will recognize that 3.3V represents a logical one at its input. In this manner, the device containing the invention can interface with peripheral components operating with different DC supply voltages.

PADs can be selectively grouped on the same integrated circuit to support different output voltages at different ports of the chip. For example in FIG. 5 the invention (I/C) Buffer) is placed at PADs 502 through 509, 511 through 518, 520 through 527, and 529 through 537. PADs 502 through 509 have their OEN* signals tied together to OEN1* and their PDA signals tied together to PDA1. PADs 511 through 518 have their OEN* signals tied together to 0EN2* and their PDA signals tied together to PDA2. PADs 520 through 527 have their OEN* signals tied together to OEN3* and their PDA signals tied together to PDA3. PADs 529 through 537 have their OEN* signals tied together to OEN4* and their PDA signals tied together to PDA4. Recall that by lowering the power supply voltage such as from 5.0V to 3.3V decreases power consumption by approximately forty percent. Thus, assume CVDD is set to 3.3V to conserve power and is distributed to all transistors connected to this supply. Assume GVDD1 (520) and GVDD3 (528) are set to 3.3V while GVDD2 (519) and GVDD4 (538) are set to 5V. Assume that the highest system voltage is 5V and that NVDD is set to this value and distributed to transistors connected to this supply. GVDD1 is the positive power supply voltage to each I/O Buffer at bonding PADs 502 through 509 such that their GVDD connections are tied to GVDD1. GVDD2 is the positive power supply to each I/O Buffer at bonding PADs 511 through 518 such that their GVDD connections are tied to GVDD2. GVDD3 is the positive power supply to each I/O Buffer at bonding PADs 520 through 527 such that their GVDD connections are tied to GVDD3. GVDD4 is the positive power supply to each I/O Buffer at bonding PADs 529 through 537 such that their GVDD connections are tied to GVDD4. Thus I/O Buffers at bonding PADs 511 through 518 and 529 through 537 will generate 5V CMOS logic levels to external devices that are connected to the pins of the respective bonding PAD. I/O Buffers at bonding PADs 502 through 509 and 520 through 527 will generate 3.3V CMOS logic levels to external devices that are connect to the pins of these respective bonding PADs. Selectively grouping bonding PADs similar to this manner allows the integrated circuit 501 to support multiple external logic levels on the same silicon die.

In the example above, enabling the input buffer and the output buffer at a group of pins that use the invention can. be accomplished by an enable register 551 which can be set by software. The register contains bits that would turn on the output buffer of the respective groups of pins. The register bits represent the OEN1*, 0EN2*, OEN3*, OEN4*, PDA1, PDA2, PDA3, and PDA4 enabling signals for the respective group of pins. Alternatively the output buffers or input receivers can be enabled by hardware by the use of enable input pins or by a control signal directly received from the core logic 550. The output buffer enable pins are represented by inputs received at bonding PADs OEN1*(540), 0EN2* (541), OEN3* (542), and OEN4* (543) in FIG. 5. Input buffers can be hardware enabled by an input buffer enable pin as well. For example PDA2 (547) is the input buffer enable pin for PADs 511 through 518.

Figure 5:
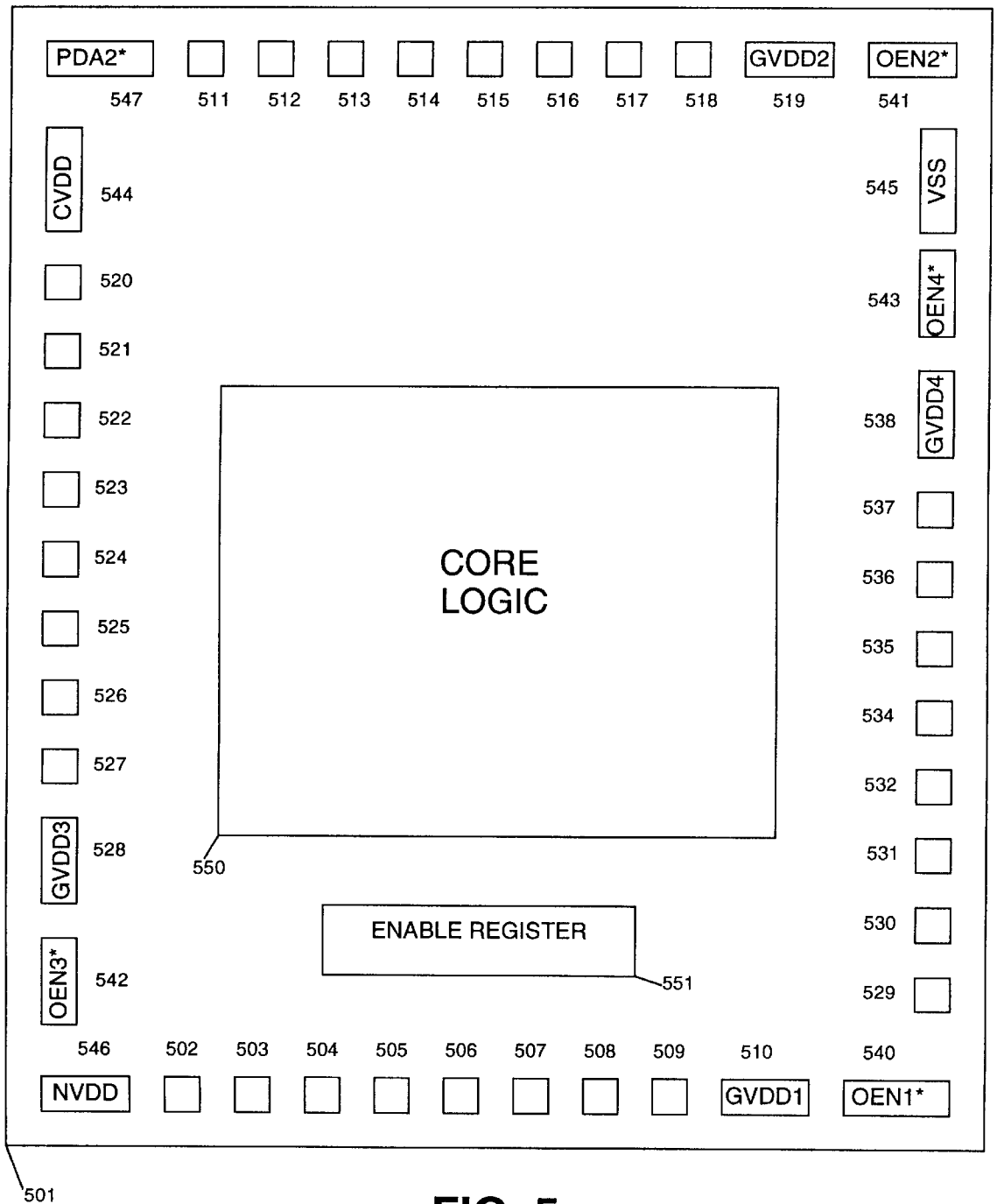
FIG. 5 illustrates an integrated circuit containing groups of the I/O Buffer as illustrated by FIG. 2 in order to support multiple voltage level outputs within the same integrated circuit.

The required DC supply voltages are also supplied to the bonding PADs in FIG. 5. The highest level of DC supply voltage NVDD is supplied at bonding PAD 546. The core logic DC supply voltage CVDD is supplied through bonding PAD 544 into the core logic 550 as well as other areas of the integrated circuit where necessary. Ground or the most negative DC supply voltage is supplied through the VSS bonding PAD 545. The output logic levels are selected for the group of I/O buffers by setting the appropriate supply voltage at GVDD1 (510), GVDD2 (519), GVDD3 (528), or GVDD4 (538) as discussed above.

Multi-voltage I/O Buffer Having Multiple Selectable Input NOR Gates

Figure 8:
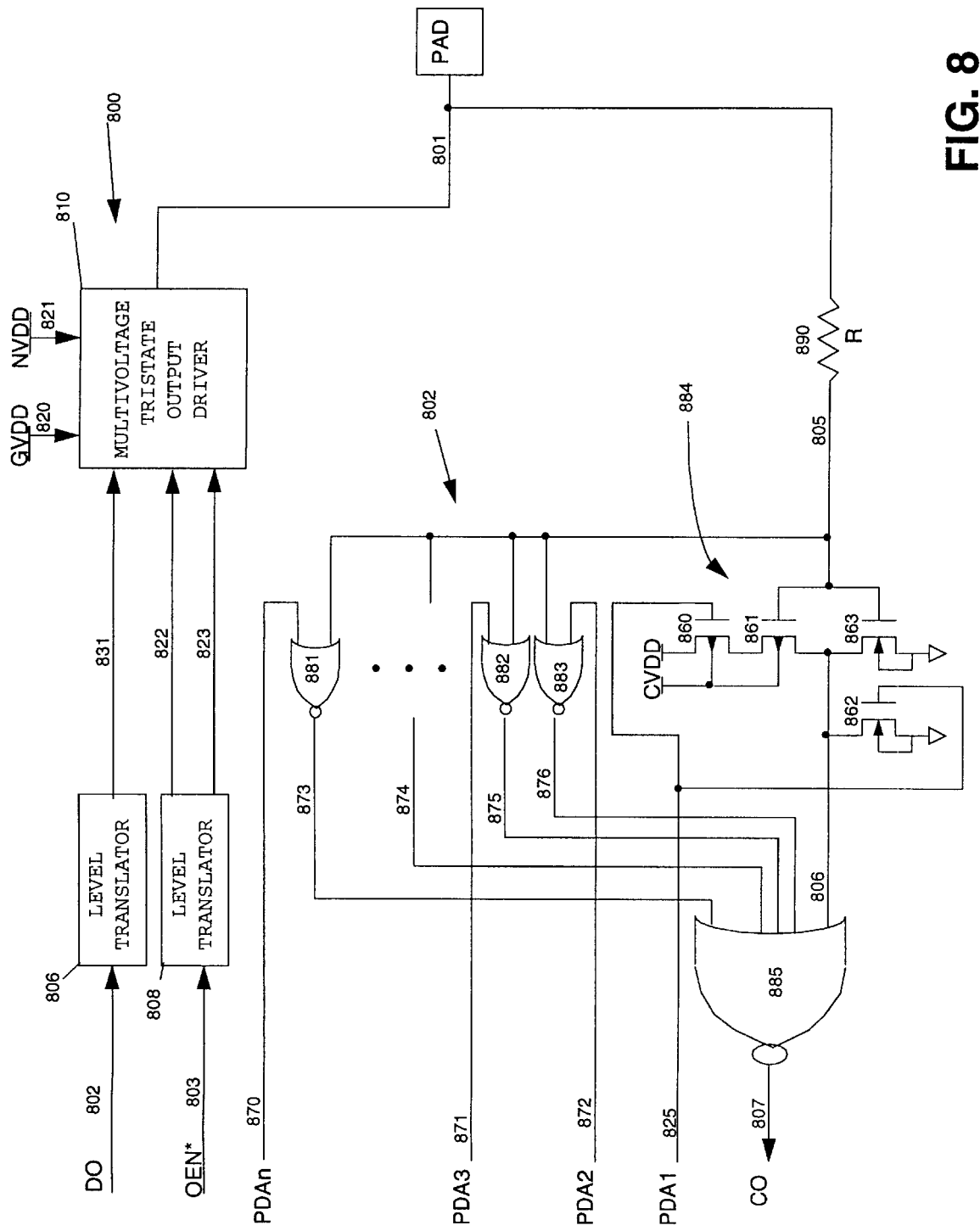
FIG. 8 is a schematic partially in block diagram form, illustrating a bi-directional I/O buffer having a set of input NOR gate receivers each having a different triggering level.
Figure 9:
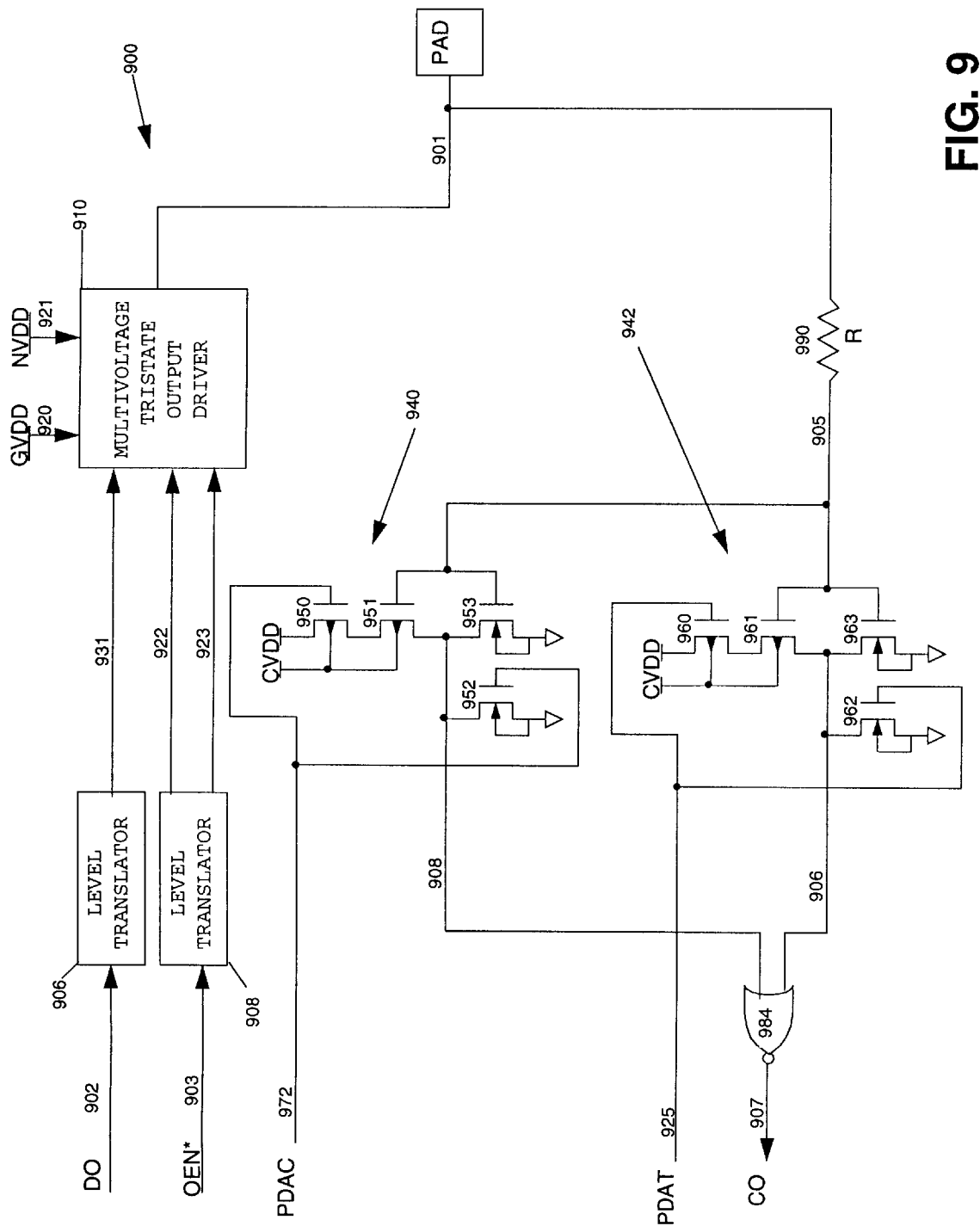
FIG. 9 is a schematic diagram, partially in block diagram form, of an alternative embodiment of the bi-directional I/O buffer of FIG. 8 having a single pair of input NOR gates.

Referring to FIGS. 8 and 9, an alternative embodiment t.o the multi-voltage bi-directional I/O buffer of FIGS. 2–7 will now be described. Whereas the bi-directional I/O buffer of FIGS. 2–7 includes only a single input-receiving NOR gate, the alternative embodiment of FIGS. 8 and 9 includes a set of input NOR gates connected in parallel. Triggering levels of the NOR gates are chosen to optimize input signal detection based upon, for example, the core voltage level (CVDD). For example, for an integrated circuit capable of operating either at various core voltages such as 3.3V or 5.0V, a pair of NOR gate receivers are provided with the triggering levels of the NOR gates optimized for receiving various input levels and either outputting the proper core voltage level signals such as 3.3V or 5.0V to the core. Prior to operation, the core voltage is detected, then the NOR gate having the appropriate triggering level is selected and all signals received as input are routed through the selected NOR gate.

Referring first to FIG. 8, an input buffer having an arbitrary number of NOR gates will be described. FIG. 8 illustrates a multi-voltage bi-directional I/O buffer 800 similar to the buffer described above with reference to FIGS. 2–7 but having a set of n NOR gates generally denoted 802. Individual exemplary NOR gates are identified by reference numerals 881, 882, 883 and 884. As can be seen from FIG. 8, NOR gates 802 are connected in parallel between an input line 805 and a multiple-input NOR gate 885 which has a single output line 807 connected to the core of the integrated circuit (not shown). Each NOR gate 802 has a first input connected to a respective PDA signal line and a second input connected to input line 805. In FIG. 8, NOR gate 881 represents an "nth" NOR gate receiving a PDA signal along input line 870. As the total number of NOR gates may be arbitrary, all NOR gates are not illustrated, rather a set of ellipsis are employed to denote additional NOR gates which are not shown. Also, it should be noted that, whereas NOR gates 881, 882 and 883 are illustrated symbolically with a NOR gate symbol, the internal circuit components of NOR gate 884 are set forth in detail. The circuit components of NOR gate 884 include transistor devices 860–863 which correspond to devices 260–263 described above with reference to FIG. 2 although devices 860–863 may have differing device sizes than those of FIG. 2.

The output buffer portion of the I/O buffer of FIG. 8 may be identical to the output portion of the I/O buffer of FIG. 2. For clarity, FIG. 8 illustrates the output buffer circuitry in block diagram form only. More particularly, a pair of level translators 806 and 808 are provided along input lines 802 and 803, respectively. Level translator 8065 corresponds to device elements 270, 271, and 266 through 269 of FIG. 2. Level translator 808 corresponds to devices 276, 277 and 272 through 275 of FIG. 2. Level translator 806 provides a single output along line 831 corresponding to line 231, whereas level translator 808 provides a pair of outputs along lines 822 and 823 corresponding to lines 222 and 223. The output buffer also includes a multi-voltage tristate output driver 810 which receives signals along lines 831, 822 and 823 and also receives GVDD and NVDD power supply signals along lines 820 and 821, respectively. Multi-voltage tristate output driver 810 corresponds to elements 250 through 259 of FIG. 2 or alternatively elements 750 through 757 of FIG. 7. A single output from multivoltage tristate output driver 810 is connected along line 801 to the I/O PAD of FIG. 8. The structure, function and operation of the output driver portion of FIG. 8 may be entirely identical to the output portion of FIG. 2 or FIG. 7 and, for brevity, no further description of the output portion is provided.

Referring to the input buffer portion of FIG. 8, as noted above, the triggering levels of NOR gates 802 are set to differing levels corresponding to, for example, different possible core voltage levels (CVDD), different silicon foundries, or different input signal levels. In other words, for the different possible core voltages, although each NOR gate is powered by the same core voltage level, for example 3.3V, perhaps only one of the NOR gates has an input triggering level optimally set for a core voltage of 3.3V. Other NOR gates have triggering levels optimized for other possible core voltage levels such as 5.0V. Other NOR gates may have triggering levels optimized for the desired fabrication technologies of different foundry services that may be used. Other NOR gates may be optimized for triggering levels matched to the input signal levels. For example, the one NOR gate having the optimal triggering level for the current CVDD level is enabled by a PDA signal received along a corresponding PDA input line. If NOR gate 884 provides the optimal triggering level for a core voltage of 3.3V, then NOR gate 884 is enabled by a signal received along line 825. None of the other NOR gates are simultaneously enabled each is individually enabled. If a different core voltage is employed such that a different NOR gate is optimal, for example NOR gate 881, then NOR gate 884 is not enabled. Rather, NOR gate 881 is enabled by a PDA enable signal received along line 870. The determination of which NOR gate is optimal is calculated by internal logic circuitry described in more detail below.

With only one NOR gate operating, an input signal received along line 805 is transmitted through only the enabled NOR gate, then inverted by multiple-input NOR gate 885. For example, if only NOR gate 883 is enabled, then an input signal is transmitted only through NOR gate 883 with the remaining NOR gates providing no output signal. NOR gate 883 toggles between high and low output signals based upon the level of input signal. Hence, NOR gate 883 outputs a signal along line 876 which is representative of the input signal, but inverted. NOR gate 885 re-inverts the signal producing a binary output signal along line 807 having high and low values optimally adjusted to match the core voltage of the integrated circuit.

FIG. 9 illustrates an embodiment having only a single pair of receiver NOR gates connected in parallel. The I/O buffer of FIG. 9 includes two NOR gate receivers 940 and 942 within the input portion of the buffer. NOR gates 940 and 942 are connected in parallel along an input line 905 between an input PAD and a multiple-input NOR gate 984. As only two NOR gates are provided in parallel, multiple-input NOR gate 984 receives only two inputs. FIG. 9 also illustrates an output portion in block diagram form which may be similar to the output portion of FIGS. 2–7. In FIG. 9, the output buffer portion 900 is represented by elements 901–903, 906, 908, 910, 920–923 and 931.

NOR gate 940 includes individual transistor elements 950–953; NOR gate 942 includes individual transistor elements 960–963. The transistor elements of NOR gates 940 and 942 function in the same manner as the corresponding NOR gates described above with reference to FIGS. 2–7, with the exception that the input triggering levels of NOR gates 940 and 942 are preferably set to different levels for optimizing the detection of input signals based upon a value of the core voltage CVDD.

NOR gate 940 receives a input signal PDAC along line 972. NOR gate 942 receives a input signal PDAT along line 925. The PDAC signal is set to an active state by internal logic circuitry (not shown), if the core voltage CVDD is a low voltage such as 3.3V CMOS and signals are to be received by the input. PDAC is set to an inactive state otherwise. The PDAT signal is set to an active state, if the core voltage CVDD is a high voltage level such as 5.0V and signals are to be received by the input. PDAT is set to an inactive state otherwise. In this manner, input signals received along input line 905 are transmitted either through NOR gate 942 or NOR gate 940, but not both. NOR 984 therefore receives a signal along either line 908 or line 906 for ultimate output to the core of the integrated circuit device along line 907. In cases where no signals are to be received both PDAT 925 and PDAC 972 are set to inactive states. Lines 908 and 906 are set to static levels so that power consumption is minimized in NOR gates 940, 942 and 984. Any noise sources at the PAD along lines 901 and 905 are ignored. Only when PDAC or PDAT is set to an active state will signals be received.

To provide for optimal translation of the input signals to the appropriate voltage CVDD, a triggering level of NOR gate 940 is set to about 50% of CVDD which is 1.65 volts for a CVDD of 3.3 volts. Whereas the triggering level of NOR gate 942 is set to the midpoint of the expected 5V TTL input levels which is about 1.4 volts. Hence, if the core voltage is 3.3V, then input signals are received through NOR gate 9410 with an appropriate triggering level of 1.65V. If the core voltage CVDD is 5.0V, then input signals are received along line 942 with an appropriate triggering level of 1.4V.

It should be noted that both NOR gates are capable of receiving input signals which are either 5.0V based signals or 3.3V based-signals. In other words, the selection of the appropriate NOR gate 942 or 940 in FIG. 9 may be made based on the voltage level of the core voltage and not upon the voltage levels of the input signals. It should also be noted that one could provide a single NOR gate for receiving the input signals, as illustrated above in FIGS. 2–7, with the triggering voltage of a single NOR gate set to an average level, such as 1.5V when operating at a core voltage of 3.3V. However, such would not provide for an optimal triggering voltage corresponding to the voltage level of the core voltage nor would it optimally lower the consumption of power. Also if the core voltage were to change to 5V the single NOR gate triggering level would move from the ideal level of 1.5V. Thus, it is preferred that for different core voltages additional NOR gates be provided taylored to the appropriate core voltage and input signals to be received.

The triggering levels of NOR gates 940 and 942 are set by fabricating the component devices of the NOR gates to have appropriate device sizes. The method by which a NOR gate may be designed or fabricated to have a specific triggering level may be achieved in accordance with conventional techniques and such techniques will not be described in detail herein.

Thus, in the embodiment of FIG. 9, an input receiving NOR gate is selected based upon the voltage level of the core voltage CVDD. In use, a determination of the appropriate NOR gate is made using internal logic circuitry within the integrated circuit (not shown). For example, the integrated circuit itself or a separate device such as a host microprocessor may include some means for detecting an optimal operational core voltage. Thereafter, the integrated circuit is controlled to operate at the optimal core voltage. Input storage registers may maintain information identifying which NOR gate is appropriate for use based on the level of the core voltage. Internal circuitry then queries the storage registers to determine which NOR gate is appropriate A preferred method for detecting the core voltage to allow for enabling an optimal input receiving NOR gate can be found therein with reference to an integrated circuit adapted for controlling a PCMCIA peripheral card. In practice, the choice of the core operating voltage for the integrated circuit having the I/O buffer of FIGS. 8–9 is made by a system designer during design of a computer system incorporating the integrated circuit. A 'Misc. Control' register bit, described on page 51 of Appendix A, stores a binary value indicating whether the core voltage is 3.3V or 5.0V. Upon power-up, the control register bit is set to indicate the installation voltage value. This may be achieved by providing a signal from a preprogrammed external device such as a PROM indicating whether the bit of the control register is to be set to indicate 3.3V or 5.0V. Thereafter, internal circuits within the integrated circuit read the value within the register and transmit an appropriate signal along one of the aforementioned PDA lines.

It should be noted that the triggering levels of the NOR gates need not be set solely based upon the core voltage level. Other parameters may be employed for selecting an appropriate triggering level. For example, triggering levels may be optimized for receiving various input signals or for particular fabrication methodologies. The particular NOR gate can be taylored for the input levels that would be received. For example future input levels may switch from zero to two volts with a input triggering point of one volt. In this case the NOR gate can be designed for the particular core voltage and an input triggering point (input switching threshold) of one volt. Alternatively a single integrated circuit may be desired to be manufactured by more than one silicon foundry. As can be appreciated by those skilled in the art, the actual switching levels for transistors may vary somewhat depending upon the methods by which the transistors are fabricated and the component materials employed. As such, triggering levels for the input-receiving NOR gates may be set to optimize signal reception for any of a variety of fabrication methodologies. Thus, if the integrated circuit may be fabricated using one of two fabrication methodologies, four input receiving NOR gates may be employed with one pair having a triggering level optimized for the first fabrication methodology and the second pair having a triggering level set for the second fabrication methodology. Of course, once the integrated circuit is actually fabricated, all signals for that circuit should be received through the appropriate NOR gates corresponding to the fabrication and fabrication transistor design parameters.

What has been described in the foregoing section is an improvement to the I/O buffers of FIGS. 2–7 wherein a set of two or more input-receiving NOR gates are provided with the triggering levels of the NOR gates optimized to particular operating conditions. It should be obvious to one of ordinary skill in the art that the input receiving NOR gates or FIGS. 8–14 may be change to input receiving NAND gates with any associated logic changes to the control signals. In the following, a system-level embodiment of the invention will now be described, wherein an integrated circuit having a bi-directional multi-voltage I/O buffer is employed as a host adapter (also referred to as card controller) for interfacing between a host computer microprocessor and a removable peripheral card, such as a PCMCIA card.

PCMCIA Host Adapter having a Multi-voltage Power Control System

Figure 10:
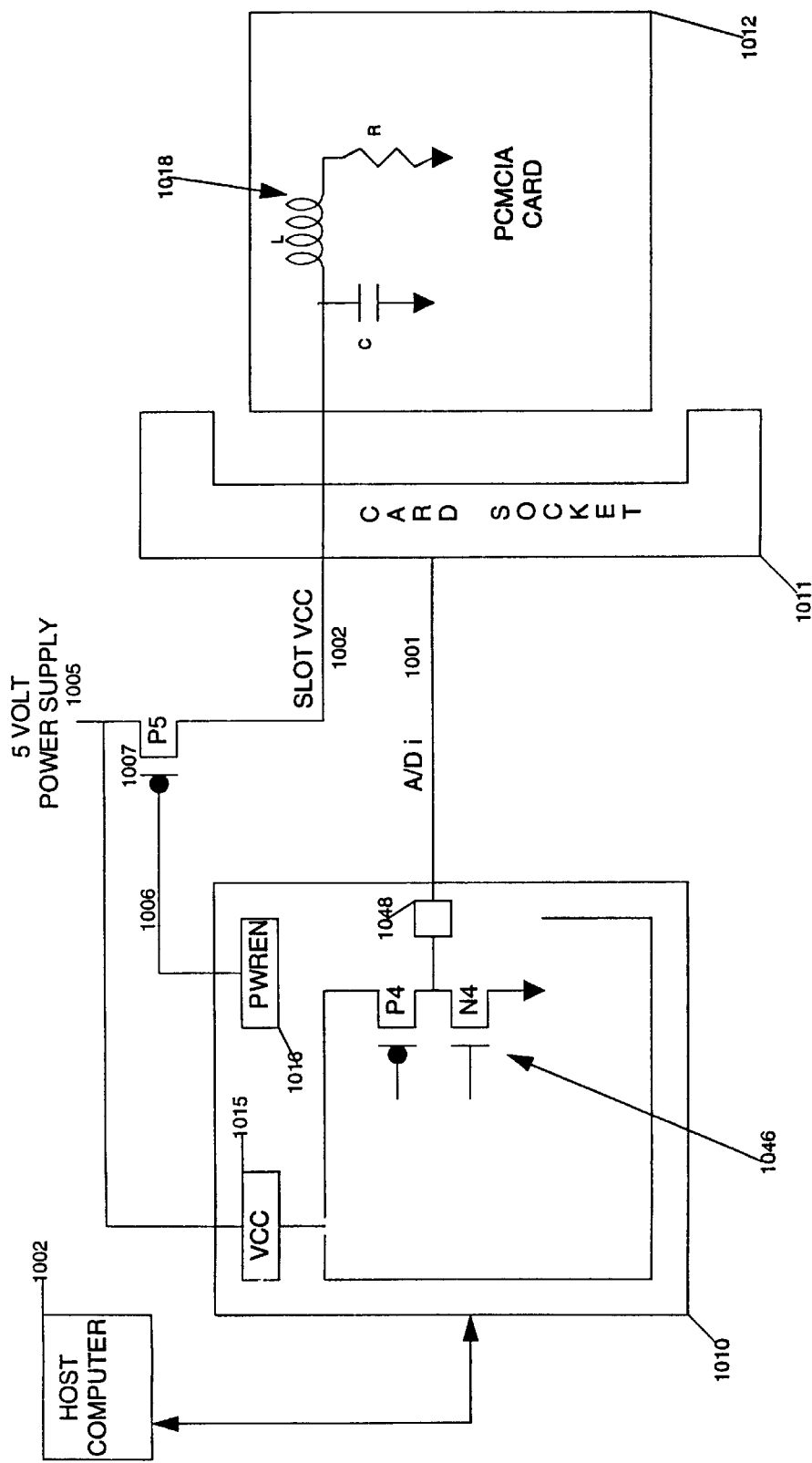
FIG. 10 is a block diagram illustrating a prior art host adapter for controlling and providing power to a PCMCIA card.

Referring to FIGS. 10–14, a host adapter, also referred to as card controller, for controlling a PCMCIA card or other plug-in integrated circuit device will now be described. Referring first to FIG. 10, a prior art host adapter will be described and certain disadvantages summarized.

FIG. 10 illustrates a host adapter system having a card controller 1010 for interfacing between a host computer 1002 and a PCMCIA card 1012. PCMCIA card 1012 is a removable card received within a card socket device 1011. The card socket supports the PCMCIA card and provides for direct electrical interconnection between the removable PCMCIA card and fixed components of the host adapter system including card controller 1010. An address/data bus

1001 interconnects card controller 1010 and PCMCIA card 1012 through card socket 1011. Power is provided to PCMCIA card 1012 through the card socket from a 5V power supply line 1005. As only a 5V power supply is provided, the host adapter 1010 of FIG. 10 is capable of controlling only PCMCIA cards which operate with 5.0V interfaces. The internal voltage of the circuitry may operate at the same or different voltages from the interface voltage.

Upon insertion of the PCMCIA card it is desirable to the power up the card. Hot insertion is to be avoided in order to protect the components within the PCMCIA card from ESD, Latch-Up or other problems including data loss. While the power supply is disabled the I/O and Command signals to the PCMCIA are disabled as well. The supply of 5V power to the PCMCIA-card is controlled by controller 1010 in connection with a P-type transistor 1007 (P5). A power enable signal line interconnects a gate of transistor 1007 and a power enable output PAD 1016 (PWREN) within card controller 1010. To initiate flow of power to PCMCIA card 1012, an enable signal is asserted onto line 1006 which turns on transistor 1007. Power flows through transistor 1007 to the PCMCIA card along a slot voltage line 1002. Due to an internal impedance within PCMCIA card 1012, represented by circuit 1018, the voltage level of power supplied to the PCMCIA card does not increase instantaneously. Rather, the voltage increases gradually over, typically, a short period of time.

Card controller 1010 includes a plurality of I/O buffers in order to interface to the card. A portion of one I/O buffer is illustrated by output driver 1046 connected to data bus 1001 through I/O pad 1048. The output driver 1046 includes a pair of P-type and N-type transistors, P4 and N4, respectively. The transistors are connected in series between a 5 volt voltage source at VCC PAD 1015 and a ground. The level of VCC may vary from 5 volts, however this causes the entire integrated circuit voltage to vary such that all interfaces are required to operate at that voltage. It is desirable to have a single interface whose power supply voltages can vary independently of the other circuits and interfaces. Gates of the transistors P4 and N4 are employed to modulate and drive signals onto bus line 1001 through I/C) PAD 1048. With no card inserted the output driver 1046 is tristated to disable signal transitions on data bus 1001. Once the card 1012 is inserted power may be supplied to the card as previously described. Then the I/O buffer 1046 can be enabled to communicate with the card 1012. While the hot insertion of the card has been avoided the enabling of the I/O buffer may cause the ESD, Latch-Up or other problems including data loss that one was trying to avoid. There is a mismatch between the time for which the PCMCIA becomes powered on and the time for which the I/O buffer becomes enabled. The impedance of the power supply is typically greater than the impedance of the I/O bus line. Thus the voltage of data signals provided along line 1001 may be substantially instantaneously at 5V before there is proper power supplied to the card. While inherent circuit delays may aid in reducing this problem for one card, it may not be sufficient for all the various cards that may be inserted.

Further with regards to FIG. 10, it can be readily appreciated that the system of FIG. 10 is capable of providing only power at a single voltage and thereby lacks an ability to control a PCMCIA card requiring a different voltage level. Moreover, certain PCMCIA cards may operate in different modes at different voltages. For example, a hard disk drive card may require one voltage level during actual spin operation of the disk, and a lower voltage level when the disk is not spinning. As another example, a fax/modem card may require one voltage when operating at a BAUD rate of 2400 but may require a higher voltage when operating at a higher BAUD rate, for example 9600 BAUD. The system of FIG. 10 does not allow the power transmitted to the PCMCIA card to be selectively varied to minimize power usage with appropriate use of the enable voltage signals.

Referring now to FIGS. 11–14, preferred embodiments of a host adapter which overcome the disadvantages of the prior art host adapter of FIG. 10 will now be described.

Figure 11:
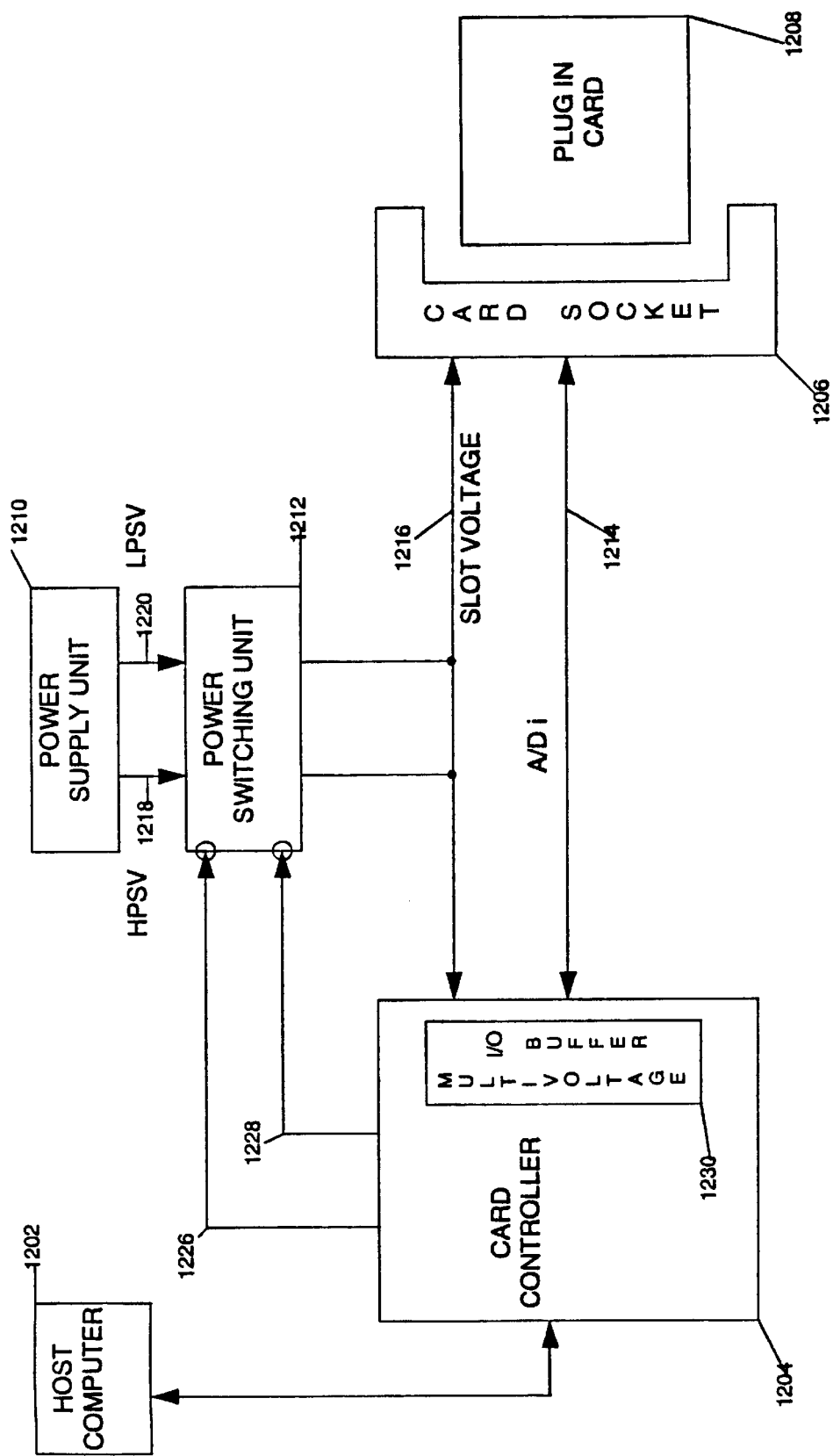
FIG. 11 is a block diagram illustrating a preferred embodiment of the invented system for controlling and providing power to a plug-in card such as a PCMCIA card.

Referring first to FIG. 11, a portion of a host adapter capable of receiving a type of plug-in card is illustrated in block diagram form. The host adapter includes a host computer 1202, a card controller 1204, a card socket 1206 and a removable PCMCIA card 1208. Also illustrated is a power supply device 1210 and power switching device 1212. Preferably the card controller 1204 is a PCMCIA card controller, plug-in card 1208 is a PCMCIA card, and host computer 1202 is a microprocessor. It should be obvious to one of ordinary skill in the art that the host adapter of the present invention can be applicable to other types of plug-in or insertable cards and circuits such as ISA, EISA, PCI, or VESA Local Bus interfacing cards.

Card controller 1204 provides an interface between host microprocessor 1202 and PCMCIA card 1208. PCMCIA card 1208 may be any type of integrated circuit card conforming to PCMCIA specifications. PCMCIA card 1208 may be a fax/modem card, a hard drive card or any of a wide variety of other peripheral cards.

In use, control signals are transmitted from host microprocessor 1202 into card controller 1204 which in turn transmits signals to PCMCIA card 1208 for controlling or accessing the card. For example, if PCMCIA card 1208 is a hard disk drive card, then host microprocessor 1202 may access data within card 1208 by transmitting appropriate control signals to card controller 1204, which in turn routes those signals into the hard disk drive card where data is accessed. Once accessed, the data is returned from PCMCIA card 1208 through card socket 1206 into card controller 1204 for transmission to microprocessor 1202.

Data, addresses and control signals are transmitted between card controller 1204 and PCMCIA card 1208 along a bus line 1214. For brevity, bus line 1214 will hereinafter be referred to as a data bus line although it should be understood that bus line may additionally transmit control signals, as well as data and addresses. Power control unit 1210 provides power simultaneously at both a low power supply voltage and a high power supply voltage along power lines LPSV 1220 and HPSV 1218, respectively. Preferably the low power supply voltage is around 3.3 volts and the high power supply voltage is around 5.0 volts. Power may initially be received by power control unit 1210 from a rechargeable battery (not shown) but could also be some other DC or AC source wherein the power control unit 1210 would provide the proper conversions. Power supply unit 1210 provides power through power switching unit 1212 to card socket 1206 and ultimately to PCMCIA card 1208 at a voltage level appropriate for operation of the PCMCIA card.

The voltage level of the power supplied to the PCMCIA card is selected by power switching unit 1212 under the control of card controller 1204. Since PCMCIA cards are removable and can be replaced by a second card that may be operating at different voltages, controller 1204 controls switching device 1212 to transmit power from either HPSV line 1218 or LPSV line 1220 to thereby provide power to the PCMCIA card at a suitable or optimal voltage level. For example, if PCMCIA card 1208 is a plug-in ROM card, it may operate at low power supply voltages. Therefore, power switching unit 1212 is controlled to transmit power to the PCMCIA card at a low voltage from LPSV line 1220. However, if the PCMCIA card is a hard disk drive card which requires a high voltage power level, then power switching unit 1212 is controlled to transmit power to the PCMCIA card from HPSV line 1218. Power from lines 1218 or 1220 is received by PCMCIA card 1208 through card socket 1206 along a slot voltage line 1216 connected to power switching unit 1212.

In use, card controller 1204 initially determines the voltage level required by the PCMCIA card. A determination of the proper voltage for PCMCIA card 1208 is made by card controller 1204 in accordance with conventional PCMCIA techniques which will be described in more detail below. Once the correct voltage level is determined, card controller 1204 transmits a power enable signal to power switching unit 1212 along either the enable high power supply line 1226 or the enable low power supply line 1228 which causes switching unit 1212 to connect the appropriate power supply line to slot voltage line 1216. Switching unit 1212 prevents power from being transmitted onto slot voltage line 1216 until the appropriate enable signals have been received.

To allow for the proper voltage level to be selected, the card controller is preferably provided with internal circuitry capable of detecting the power supply voltage required by the PCMCIA card. For the example of the hard disk drive card, the card controller is provided with circuitry capable of determining the operational mode of the PCMCIA card. Thereafter, the card controller device transmits appropriate voltage enable signals to the power control device to select for the appropriate voltage. The foregoing is particularly advantageous in the systems such as laptop or notebook computers, wherein power usage must be minimized to the greatest extent possible. For PCMCIA cards, the initial interface voltage requirements to read the Card Information Structure ("CIS") are detected using VS1 and VS2 pins. These pins use a combination of pull-up or pull-down resistors to establish the initial read voltage for the PCMCIA card. The "tuple" register is then read to determine what operating voltages and interface voltages that the PCMCIA card may function with under various conditions. This information may be provided to the host computer of the system in order to determine the optimum operating characteristices for the overall system. For PCMCIA cards lacking the VS1 and VS2 pins, the "tuple" register within the PCMCIA card is accessed with a nominal voltage such as 5V to determine the appropriate voltages that the PCMCIA card may function with as well as what voltages the PCMCIA card will interface with.

The internal core circuitry of card controller 1204 may or may not receive power from power control unit 1210. Preferably the internal core circuitry is powered from a low voltage source such as 3.3 volts however it may also be powered from a high voltage source such as 5.0 volts. Thus the PCMCIA card may operate its interface at a voltage of 3.3V, while portions of the card controller may operate at a voltage of 5.0V. Card controller 1204 therefore includes a multi-voltage bi-directional I/O buffer such as described above with reference to FIGS. 2–9 for translating input and output signals from one voltage level to another to allow communications between a 5.0V card controller and a 3.3V PCMCIA card. However, even if provided with appropriate multi-voltage translation circuitry, the power mismatch problem described above with reference to FIG. 10 could occur. The system of FIG. 11 avoids this and other problems, by providing power switching device 1212 in combination with the control logic internal to card controller 1204 generating the power control signals 1226 and 1228 and the appropriate connections for the multivoltage I/O buffer 1230.

More specifically, power output from switching device 1212 provided onto slot voltage line 1216 and is received both by card socket 1206 and by an input pin on card controller 1204. As will be described more fully below, multivoltage I/O buffer 1230 is connected to receive power from slot voltage line 1216 such that data cannot be transmitted onto bus line 1214 until power is supplied along slot voltage line 1216. This prevents the aforementioned problem wherein data signals may be provided by the card controller 1204 along the data bus line 1214 before sufficient power is provided to the PCMCIA plug-in card 1208 along the slot voltage line 1216. Moreover, by powering multivoltage I/O buffer 1230 with power from slot voltage line 1216, the voltage level of signals transmitted along bus line 1214 match the voltage of power provided to the PCMCIA card along slot voltage line 1216.

Figure 12:
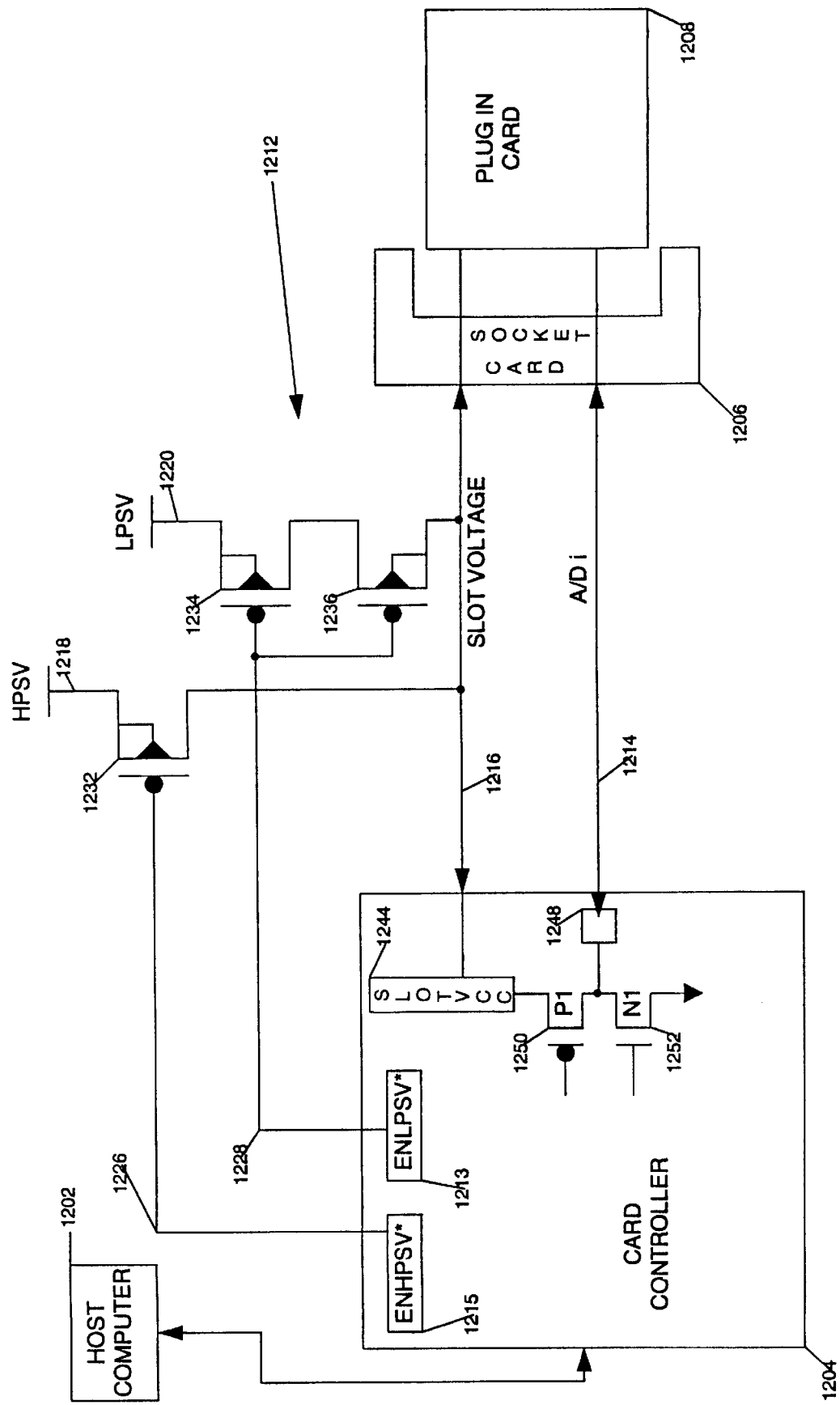
FIG. 12 is a block diagram, partly in schematic form illustrating the power distribution system for a system having a plug-in card connected to a card controller such as that illustrated by the block diagram of FIG. 11.
Figure 13:
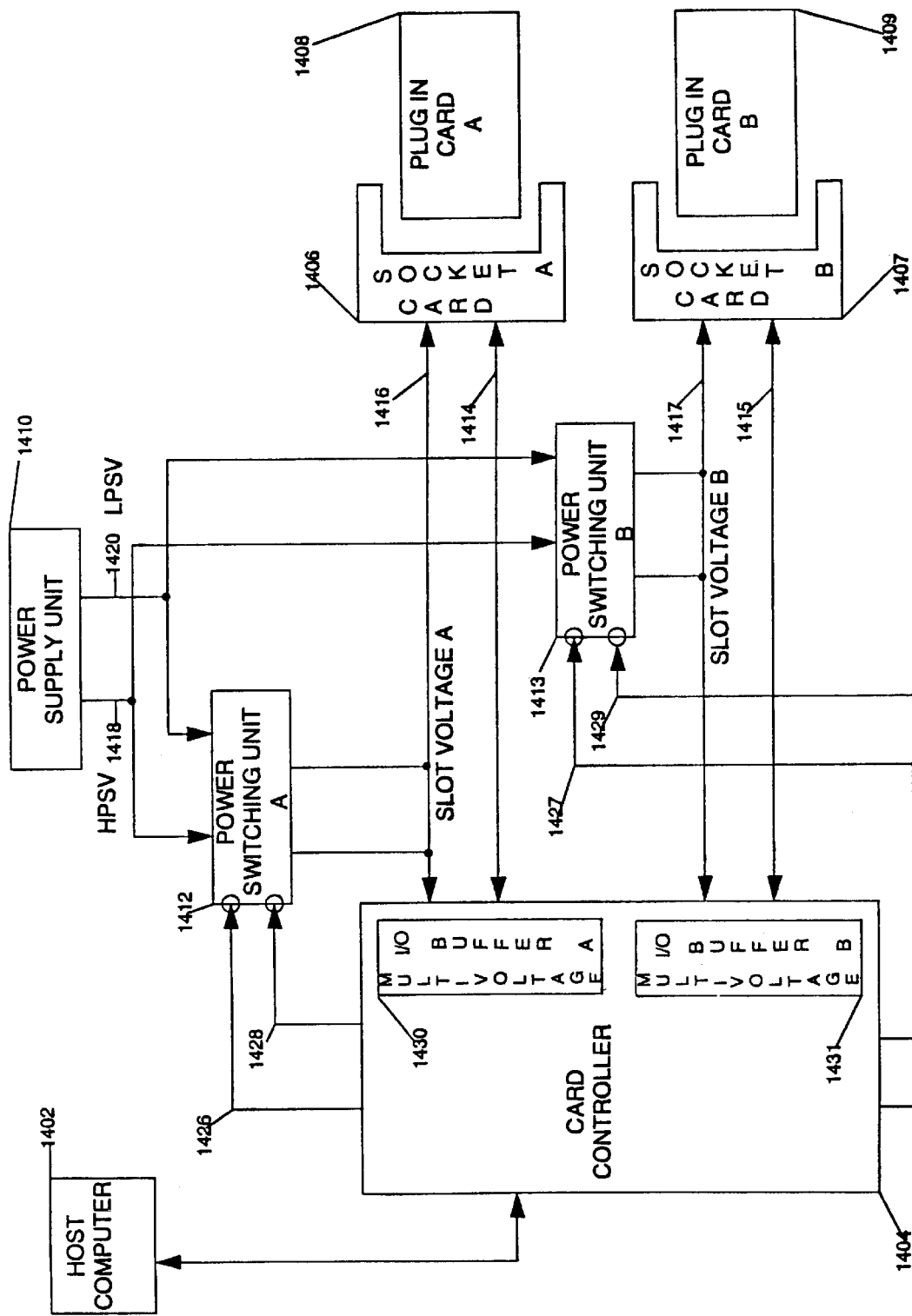
FIG. 13 is a block diagram illustrating two plug-in cards, such as PCMCIA cards, being controlled by the card controller.
Figure 14:
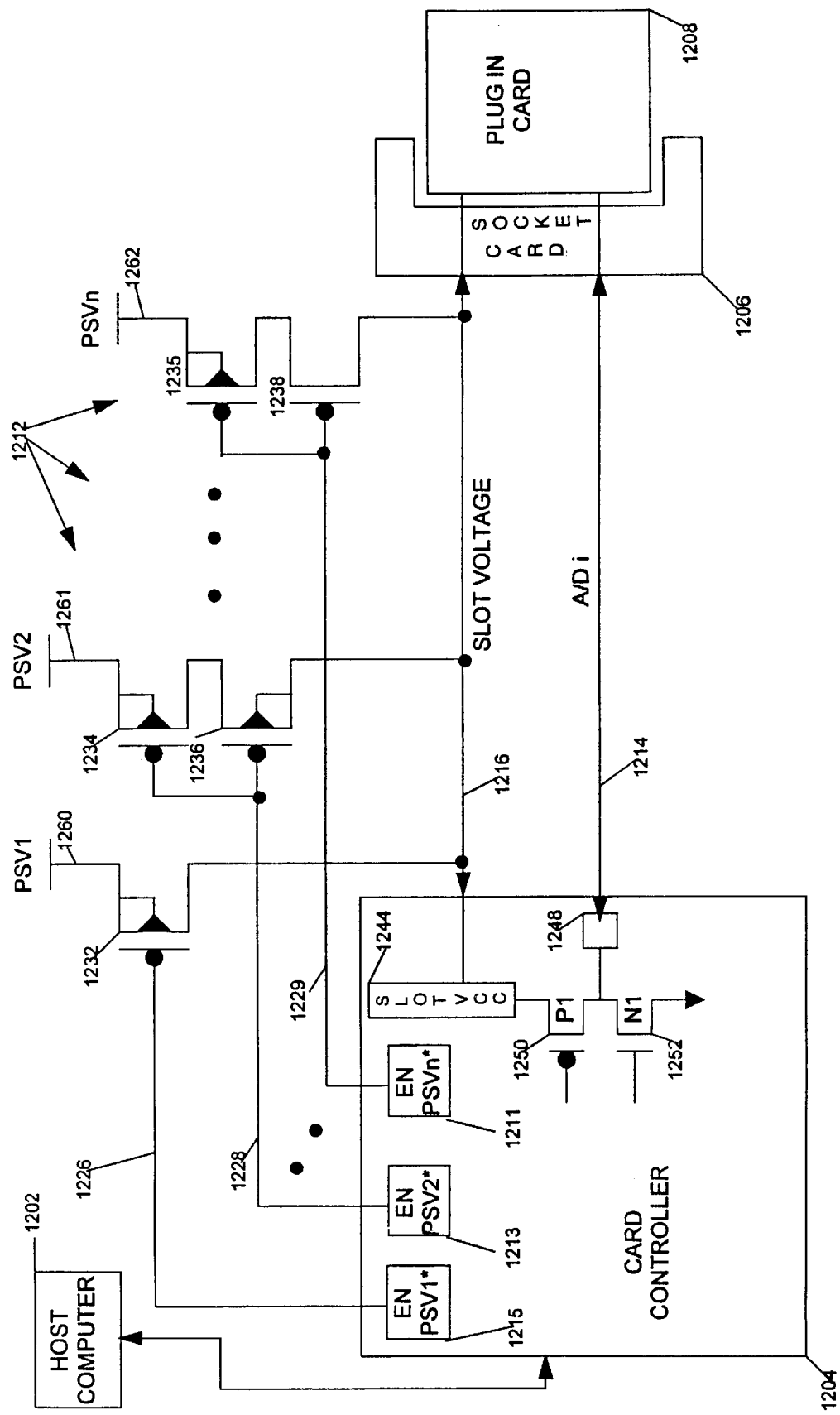
FIG. 14 is a block diagram, partly in schematic form, illustrating an alternate embodiment of the power distribution system for a system having a plug-in card connected to a card controller.

These features are more fully illustrated in FIG. 12 and FIG. 14 which illustrate a portion of the system of FIG. 11. In particular, FIG. 12 and FIG. 14 illustrates certain internal components of card controller 1204 and switching unit 1212. FIG. 14 illustrates an alternate embodiment of FIG. 12 wherein multiple supply voltages PSV1, PSV2, through PSVn are supplied to a plug-in card. Power supply voltage PSV1 1260 is illustrated as being the highest level of power supply voltage, such as 5.0V. Multiple transistor elements, indicated by the ellipses, are employed to switch the multiple levels of power supply voltages to the slot voltage line 1216. The nth power supply voltage PSVn is switched onto the slot voltage 1216 by transistors elements 1235 and 1238. Only one power supply voltage PSV at a time is switched onto slot voltage line 1216. In the case where no plug-in card is inserted into the card socket 1206 or where no transactions or activity is occuring with the plug-in card, all power supply voltages PSV may be disconnected from the slot voltage line thereby powering down the plug-in card and the multivoltage I/O buffer 1230. Other operating characteristics of FIG. 14 will be readily apparent from the discussion below with reference to FIGS. 11–13.

Switching unit 1212 of FIG. 12 preferably includes three P-type transistors, denoted 1232, 1234, and 1236. Transistor 1232 is provided along HPSV line 1218. Transistors 1234 and 1236 are provided in series along LPSV line 1220. The gate of transistor 1232 is connected to the enable high power supply voltage line 1226 whereas gates of both transistors 1234 and 1236 are connected to enable low power supply voltage line 1228. As can be seen, transistor 1232 is turned ON only if an enable signal is received along line 1226, thereby activating the flow of power along the HPSV line 1218 to slot voltage line 1216. Likewise, transistors 1234 and 1236 are turned ON only if the enable signal is received along enable low power supply voltage line 1228. Thus, power is only provided to slot voltage line 1216 along LPSV line 1220 if the enable low power supply voltage signal is received by data switching unit 1212. It should be noted how the transistor components of power switching unit 1212 are oriented. In particular transsistor 1236 is oriented so that when slot voltage line is greater than the voltage level for LPSV line 1220 the instrinsic diodes within the mosfet transistors keep any excess reverse leakage from occuring. The difference between HPSV and LPSV may cause excess reverse leakage for the case where transistor 1234 is properly turned OFF or if the voltage applied to the gates of transistors 1234 and 1236 is different than the LPSV level the transistors would be turned ON allowing the current to flow. Transistor 1234 is oriented so that when both power enable lines 1215 and 1213 are disabled and slot voltage line 1216 is near zero the LPSV 1220 does not leak current through to the slot voltage line 1216. Thus the configuration of the transistor components is such that power consumption is minimized. It should be obvious to one of skill in the art that the positions of transistor components 1234 and 1236 may be switched so that the sources of the transistors are connected together and still maintain the low power consumption.

Thus, power is received along slot voltage line 1216 from the HPSV or the LPSV power supply depending upon the enable signals provided by card controller 1204. Slot voltage line 1216 is connected to a SLOT VCC PAD 1244 within card controller 1204. SLOT VCC PAD 1244 is itself connected to a p-channel type transistor of the multivoltage I/O buffer 1230 which drives address, data or control signals onto data bus 1214 through I/O PAD 1248.

Multivoltage I/O buffer 1230 is the block representation of FIG. 2. Alternatively Multivoltage I/O buffer represents the schematics of FIG. 6 through FIG. 9. Preferably the Multivoltage I/O buffer 1230 represents FIG. 9. The output portion of multivoltage I/O buffer 1230 is represented by level translators 906 and 908 and the multivoltage tristate output driver 910 of FIG. 9. Referring to FIG. 2, the output. portion of 1230 is represented by the transistors 250–259, 266–271, and 272–277. The input portion of 1230 is preferably represented by transistors 950–953, 960–963, and NOR gate 984 of FIG. 9. Thus P-type transistor 1250 of FIG. 12 corresponds to P-type transistor 250 of FIG. 2, or P-type transistor 65C of FIG. 6, or P-type transistor 750 of FIG. 7. The N-type transistor 1252 of FIG. 12 corresponds to N-type transistor 251 of FIG. 2, or N-type transistor 651 of FIG. 6 or N-type transistor 751 of FIG. 7. Transistors 1250 and 1252 are illustrated to show the proper connection of the final output transistors of FIG. 2–7 of the multivoltage I/O buffer. Thus, the multivoltage I/O buffer 1230 includes P-type transistor 1250 and an N-type transistor 1252 connected in series between PAD 1244 and a ground. The gates of transistors 1250 and 1252 are connected to other transistors internal to the multivoltage I/O buffer which is then connected to the internal logic of the card controller 1204 for modulating signals onto data line 1214. With the configuration illustrated, data line 1214 is disabled unless a voltage is received along slot voltage line 1216 through PAD 1244. In other words, without power along the slot voltage line 1216, P-type transistor 1250 of the multivoltage I/O buffer 1230 is inactive regardless of signal levels received at the gate of transistor 1250. Hence, data signals cannot be transmitted along line 1214 until power has been supplied to line 1216. The aforementioned circuit configuration ensures that the voltage of signals provided along data line 1214 matches the voltage of power along line 1216. As power gradually rises along voltage along line 1216, the voltage level of signals transmitted along data line 1214 also gradually rises. In this manner, the voltage of data signals gracefully matches the instantaneous voltage of the power provided along slot voltage line 1216. As noted above, this is particularly important in the event the PCMCIA card includes a significant internal impedance preventing input power from being instantaneously transmitted into the PCMCIA card.

It should be noted that a power supply unit 1210, such as that illustrated in FIG. 11, is not necessarily required. Rather, by providing the switching elements of power switching unit 1212, lines 1218 and 1220 may be connected directly to a source of HPSV and LPSV. Power switching unit 1212 provides the minimal switching logic necessary for controlling the power along lines 1218 and lines 1220. A dedicated power control device is preferred since such provides power at both a low power supply voltage such as 3.3 and a high power supply voltage such as 5.0 volts from a battery having a nominal voltage greater than 5 volts. Furthermore, depending upon power supply unit 1210 used, sometimes referred to as power controller device, power switching unit 1212 may not be required. Rather, the power supply unit 1210 may itself provide the necessary switching before outputting a voltage in response to a voltage enable signal while also providing the short circuit protection afforded by the diodes of the power switching unit 1212. Furthermore, even where both a power supply unit and a power switching unit are employed, it may be desirable to connect the power enable lines 1216 and 1228 into power supply unit 1210 as well as into power switching unit 1212. Whether such can or should be provided depends upon the particular power supply unit employed. A suitable power supply unit is the MAX 782 power controller provided by MAXIM corporation of Sunnyvale, Calif.

FIG. 13 illustrates an alternative embodiment to the systems of FIGS. 11–12 wherein a single card controller 1404 is provided which is capable of simultaneously controlling two separate plug-in cards 1408 and 1409. Preferably plug-in cards A and B, 1408 and 1409, are a type of PCMCIA card. As can be seen from FIG. 13, two sockets 1406 and 1407 are provided along with two power switching units 1412 and 1413. However, card controller 1404 includes twice the number of input and output PADs, as well as appropriate internal circuitry for controlling two PCMCIA cards simultaneously. In particular controller 1404 includes two multivoltage I/O buffers 1430 and 1431, each interconnected to separate slot voltage and data bus lines. In FIG. 13, the duplicate elements are referred to as "A" elements or "B" elements. As can be seen, each set of A elements and each set of B elements correspond to the single set of elements illustrated in FIGS. 11–12. As these elements function in the same manner as corresponding elements of FIGS. 11–12, a description of the function and operation will not be repeated. It should be noted, however, that a single power supply unit 1410 is employed, rather than a pair of power supplies. If desired, two power supply units could alternatively be employed.

Although a variety of PCMCIA card controller devices may be employed as the card controller of the embodiments of FIGS. 11–13, a Cirrus Logic CL-PD6710 or PD6720 card controller is preferably employed. The PD6710 provides for control of a single PCMCIA card as illustrated in FIGS. 11–12, whereas the PD6720 provides for simultaneously controlling two PCMCIA cards as set forth in FIG. 13.

Although primarily described with reference to PCMCIA cards, those skilled in the art will readily appreciate that principles of the invention can be exploited in a wide variety of multi-voltage environments. In general, the invention can be advantageously exploited in any system having two or more integrated circuits which possibly operate at differing voltages. Other advantages of the invention will be apparent to those skilled in the art. While a preferred embodiment of the present invention has been disclosed and described in detail herein, it will be obvious to those skilled in the art that various changes in form and detail may be made therein without departing from the spirit and scope thereof.

We claim:

1. In a computer system capable of receiving a peripheral card and having a card controller for controlling the peripheral card, a power supply for providing power to the peripheral card through a power line, and a signal transmission line for transmitting signals from the card controller to the peripheral card, an improvement comprising:

an output driver in the card controller for driving the signal transmission line responsive to signals provided to the output driver;

the output driver being powered by the same power line as the pheripheral card; and, the output driver providing signals on the signal transmission line limited in amplitude by the voltage on the power line irrespective of the voltage of the signals provided to the output driver.

2. In a computer system having first and second integrated circuits, a power supply for providing power to the first integrated circuit through a power line, and a signal transmission line for transmitting signals from the second integrated circuit to the first integrated circuit, an improvement comprising:

an output driver in the second integrated circuit for driving the signal transmission line responsive to signals provided to the output driver;

the output driver being powered by the same power line as the first integrated circuit; and, the output driver providing signals on the signal transmission line limited in amplitude by the voltage on the power line irrespective of the voltage of the signals provided to the output driver.

3. A host adapter for controlling a removable peripheral card, said host adapter including:

a power supply;

a card socket for receiving said peripheral card;

a slot voltage power line coupling said power supply to said peripheral card through said card socket;

a peripheral card controller;

a signal transmission line coupling said peripheral card controller to said peripheral card through said card socket;

an output driver in the peripheral card controller having a power input and driving the signal transmission line responsive to signals provided to the output driver; and a power interconnection line coupling the power input of said output driver to said slot voltage power lines the output driver providing signals on the signal transmission line limited in amplitude by the voltage on the slot voltage power line irrespective of the voltage of the signals provided to the output driver.

4. The host adapter of claim 3, wherein said peripheral card is a PCMCIA peripheral card.

5. The host adapter of claim 3, wherein said power supply provides power at 3.3V on a first power line and at 5.0V on a second power line, and wherein a switching unit connects either said first or second power supply line to said slot voltage line.

6. A host adapter for controlling a peripheral card, said host adapter including:

an integrated circuit card controller device and a slot voltage input/output pad;

a power control device having a plurality of power output lines each connected to the slot voltage input/output pad of the peripheral card by a slot voltage line;

a card socket device having a slot for receiving the peripheral card, said card socket device being connected to said integrated circuit card controller device by a signal transmission line and to the power output lines of the power control device by the slot voltage line;

means for activating a selected one of said plurality of power output lines at any one time; and means for activating said signal transmission line only after activation of said selected power output lines, wherein signals provided on said signal transmission line are limited in amplitude by the voltage on the slot voltage line irrespective of the voltage of the signals provided to said means for activating said signal transmission line.

7. The apparatus of claim 6, wherein said power control device includes first and second power output lines, said card controller includes first and second power output enable pins, and wherein said means for activating a selected power line comprises:

a first pMOS transistor having a source connected to said first power output line of the power control device, a gate connected to the first voltage output enable pin of thus card controller device, and a drain connected to said slot voltage line;

a second pMOS transistor having a source connected to said second power output line of the power control device, a gate connected to the second output voltage enable pin of the card controller device, and a drain; and a third pMOS transistor having a source connected to the drain of the second pMOS transistor, a gate connected to the second output voltage enable pin of the card controller device, and a drain connected to said slot voltage line.

8. The apparatus of claim 6, wherein said card controller includes a plurality of power output enable pins, each corresponding to a respective power output line of said power control device, and wherein said means for activating a selected one of said plurality of power output lines at any one time comprises:

a plurality of switches connected along respective power output lines to respective power output enable output pins of said card controller, with one of said switches connecting a respective power output line to said slot voltage line in response to an power output enable signal received from said card controller through a respective output enable pin.

9. The apparatus of claim 7, further including breakdown prevention means for preventing a highest voltage line of said plurality of power output lines from being transmitted to a lower voltage power output line.

10. The adapter of claim 9, wherein said means for activating said signal transmission line comprises:

a fourth pMOS transistor having a source connected to said slot voltage input/output pad, a gate, and a drain connected to said signal transmission line;

a first nMOS transistor having a source connected to said signal transmission line, a gate, and drain connected to ground; with said goes of said fourth pMOS transistor and said first nMOS transistor being connected to core circuitry within said card controller device.

11. A method for controlling a peripheral circuit in a system having a controller device for transmitting control signals to said peripheral circuit on a signal transmission line, said controller device including an output driver for driving signals onto said signal transmission line responsive to input signals to said output driver, and a power supply for providing power to said peripheral circuit along a power supply line, said method comprising:

controlling said power supply to provide power to said power supply line;

powering said output driver using power from said power supply line so that the output driver transmits signals to said peripheral circuit, along said signal transmission line, which are limited in voltage by the voltage on said power supply line, irrespective of the voltage of the input signals to said output driver.

12. In a host adapter for controlling two or more peripheral cards, wherein the host adapter includes an integrated circuit card controller device with first and second voltage output enable pins and a slot voltage input/output pad, a power control device having first and second high voltage power outputs, and a card socket device having a slot for receiving a peripheral card, with said card socket device being connected to said integrateld circuit card controller device by a slot voltage line and by a signal transmission line, a method for transmitting signals to said peripheral card, said integated circuit card controller device including an output driver for driving signals onto said peripheral circuit along said signal transmission line, comprising the steps of:

activating one of a first and a second power supply line at any one time;

activating said signal transmission line only after activation of said first or second power supply line, wherein the output driver provides signals on said signal transmission line, which are limited in amplitude by the voltage on the slot voltage line, irrespective of the voltage of the signals provided to the output driver.

13. The method of claim 12, wherein said step of activating one of said first and second power lines comprises the steps of:

transmitting a power enable signal from either
said first voltage output enable pin to a first pMOS transistor having a source connected to the first high voltage output power pin of the power control device, a gate connected to the first voltage output enable pin of the card controller device, and a drain connected to said slot voltage line; or
from the second power enable pin to both a second pMOS transistor having a source connected to the second high voltage output power pin of the power control device, a gate connected to the second output voltage enable pin of the card controller device, and a drain; and a third pMOS transistor having a source connected to the drain of the second pMOS transistor, a gate connected to the second output voltage enable pin of the card controller device, and a drain connected to said slot voltage line.

14. The method of claim 12, wherein said step of activating said signal transmission line comprises the steps of:

feeding power from said slot voltage line to a source of a fourth pMOS transistor, wherein said fourth transistor has a drain connected to said signal transmission line; and transmitting signals onto a gate of said fourth transistor.

15. A host adapter for controlling two or more peripheral cards, said host adapter comprising:

two or more peripheral card interconnection sockets for receiving removable peripheral integrated circuit cards;

a power supply for providing power independently to said two or more peripheral cards through said interconnection sockets; and a single card controller device for independently controlling said two or more peripheral cards, said card controller device providing power enable signals to said power supply for controlling power supplied to said two or more peripheral cards, and with said card controller independently providing control signals to said two or more peripheral cards through respective card sockets, each card socket having a slot for receiving peripheral card, each card socket being connected to the card controller by a slot voltage line and by a signal transmission line, said power supply providing power to said two or more peripheral devices at one of two or more voltage levels, with said power enabling signals controlling said power supply to provide power to said two or more devices at selected voltage levels;

said card coroller including two or more output drivers, each output driver corresponding to each of said two or more peripheral devices, for providing signals on a corresponding signal transmission line, said signals being limited in amplitude by the voltage on a correspond slot voltage line irrespective of the voltage of the signals provided to the output driver.

16. A host adapter for controlling two peripheral integrated circuit cards, said host adapter comprising:

an integrated circuit controller device;

a power supply device;

first and second card socket devices for each receiving a removable peripheral card;

first and second power supply lines interconnecting said power supply device and respective card socket devices;

first and second switching units connected to said first and second power supply lines, respectively, said switching devices controlling power flow onto said power supply lines;

first and second signal transmission lines connecting respective first and second output drivers of said controller device to respective card socket device; and first and second power interconnection lines connecting respective first and second power supply lines to said first and second output drivers, with said first and second output drivers receiving power from said respective power interconnection lines at a voltage level equal to a voltage level of power supplied to said peripheral cards wherein the power supply provides power at first and second voltage levels to respective switching devices and wherein said switching devices transmit power, if at all, onto respective power supply lines either at said first voltage level, or said second voltage level;

wherein said first and second output drivers each provide signals on the respective first and second signal transmission line, which are limited in amplitude by the voltage on the respective first and second power interconnection line, irrespective of the voltage of the signals provided to the corresponding first and second output drivers.

17. A host adapter for controlling a removable peripheral card, said host adapter including:

a power supply providing power at 3.3V on a first power line and at 5.0V on a second power line, and including a switching unit to connect either said first or second power supply line to a slot voltage line;

a card socket for receiving said removable peripheral card;

a slot voltage power line coupling said power supply to said removable peripheral card through said card socket;

a peripheral card controller;

a signal transmission line coupling an output driver of said peripheral card controller to said removable peripheral card through said card socket; and a power interconnection line coupling a power input of said output driver to said slot voltage power line;

the peripheral card controller having an output-driver that provides signal on the signal transmission line, which are limited in amplitude by the voltage on the slot voltage power line irrespective of the voltage of the signals provided to the output driver.

* * * * *